US010455357B2

(12) United States Patent
Wootton et al.

(10) Patent No.: US 10,455,357 B2
(45) Date of Patent: *Oct. 22, 2019

(54) DETECTING LOCATION WITHIN A NETWORK

(71) Applicant: Ivani, LLC, Dardenne Prairie, MO (US)

(72) Inventors: John Wootton, St. Louis, MO (US); Matthew Wootton, O'Fallon, MO (US); Chris Nissman, Tucson, AZ (US); Victoria Preston, Edgewater, MD (US); Jonathan Clark, St. Louis, MO (US); Justin McKinney, Wildwood, MO (US); Claire Barnes, University City, MO (US); Xinyu Xiao, Terre Haute, IN (US); Zhecan Wang, Needham, MA (US)

(73) Assignee: IVANI, LLC, Dardenne Prairie, MO (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/674,328

(22) Filed: Aug. 10, 2017

(65) Prior Publication Data

US 2017/0366938 A1 Dec. 21, 2017

Related U.S. Application Data

(63) Continuation-in-part of application No. 15/600,380, filed on May 19, 2017, now Pat. No. 10,064,013, (Continued)

(51) Int. Cl.
*H04W 24/00* (2009.01)
*H04W 4/02* (2018.01)
(Continued)

(52) U.S. Cl.
CPC .............. *H04W 4/023* (2013.01); *G01V 3/12* (2013.01); *G11C 11/2257* (2013.01); (Continued)

(58) Field of Classification Search
CPC ...... G01S 5/02; H04L 29/08657; H04W 4/02; H04W 4/029; H04W 64/00
See application file for complete search history.

(56) References Cited

U.S. PATENT DOCUMENTS 4,054,879 A 10/1977 Wright et al.
4,649,388 A 3/1987 Atlas
(Continued)

FOREIGN PATENT DOCUMENTS

CA 2834522 A1 5/2014
CA 2945702 A1 8/2015
(Continued)

OTHER PUBLICATIONS

International Search Report, International Patent Application No. PCT/US2015/013127, dated Apr. 24, 2015 (10 pages).
(Continued)

*Primary Examiner* — Shantell L Heiber
(74) *Attorney, Agent, or Firm* — Lewis Rice LLC

(57) ABSTRACT

Systems and methods for detecting the presence of a body in a network without fiducial elements, using signal absorption, and signal forward and reflected backscatter of radio frequency (RF) waves caused by the presence of a biological mass in a communications network.

10 Claims, 4 Drawing Sheets

Related U.S. Application Data which is a continuation of application No. 15/227,717, filed on Aug. 3, 2016, now Pat. No. 9,693,195.

(60) Provisional application No. 62/252,954, filed on Nov. 9, 2015, provisional application No. 62/219,457, filed on Sep. 16, 2015.

(51) Int. Cl.

| | | |
|---|---|---|
| *H04L 5/00* | (2006.01) | |
| *H04L 1/00* | (2006.01) | |
| *H04W 64/00* | (2009.01) | |
| *G01V 3/12* | (2006.01) | |
| *H04W 4/04* | (2009.01) | |
| *H04B 17/318* | (2015.01) | |
| *H04W 4/80* | (2018.01) | |
| *G11C 11/22* | (2006.01) | |
| *H04B 17/27* | (2015.01) | |
| *H04W 4/30* | (2018.01) | |
| *H04W 4/33* | (2018.01) | |
| *G01V 1/00* | (2006.01) | |

(52) U.S. Cl.
CPC ...... *G11C 11/2259* (2013.01); *G11C 11/2273* (2013.01); *G11C 11/2293* (2013.01); *G11C 11/2297* (2013.01); *H04B 17/27* (2015.01); *H04B 17/318* (2015.01); *H04L 1/0018* (2013.01); *H04L 5/006* (2013.01); *H04W 4/043* (2013.01); *H04W 4/30* (2018.02); *H04W 4/33* (2018.02); *H04W 4/80* (2018.02); *H04W 64/00* (2013.01); *G01V 1/001* (2013.01); *G11C 11/221* (2013.01)

(56) References Cited

U.S. PATENT DOCUMENTS

| | | |
|---|---|---|
| 4,740,045 A | 4/1988 | Goodson et al. |
| 5,270,720 A | 12/1993 | Stove |
| 5,563,455 A | 10/1996 | Cheng |
| 5,696,514 A | 12/1997 | Nathanson et al. |
| 6,075,797 A | 6/2000 | Thomas |
| 6,493,380 B1 | 12/2002 | Wu et al. |
| 6,539,483 B1 | 3/2003 | Harrison et al. |
| 6,573,861 B1 | 6/2003 | Hommel et al. |
| 6,693,536 B2 | 2/2004 | Bauer, Jr. et al. |
| 7,047,015 B2 | 5/2006 | Hawe |
| 7,295,109 B2 | 11/2007 | Kobayashi |
| 7,317,419 B2 | 1/2008 | Sugar et al. |
| 7,423,576 B2 | 9/2008 | Sahinoglu et al. |
| 7,652,617 B2 | 1/2010 | Kurtz et al. |
| 7,663,325 B2 | 2/2010 | McDonough et al. |
| 7,733,220 B2 | 6/2010 | Libby |
| 8,138,918 B2 | 3/2012 | Habib et al. |
| 8,274,386 B1 | 9/2012 | Dea et al. |
| 8,354,925 B1 | 1/2013 | Libby et al. |
| 8,402,543 B1 | 3/2013 | Ranjan et al. |
| 8,456,304 B2 | 6/2013 | van Doorn et al. |
| 8,502,666 B1* | 8/2013 | Tam .................. G01V 3/12 |
| | | 340/544 |
| 8,531,134 B2 | 9/2013 | Chemel et al. |
| 8,536,998 B1 | 9/2013 | Siu et al. |
| 8,552,664 B2 | 10/2013 | Chemel et al. |
| 8,555,388 B1 | 10/2013 | Wang et al. |
| 8,593,264 B2 | 11/2013 | Umezawa et al. |
| 8,624,734 B2 | 1/2014 | Inomata et al. |
| 8,682,812 B1 | 3/2014 | Ranjan |
| 8,762,298 B1 | 6/2014 | Ranjan et al. |
| 8,766,556 B2 | 7/2014 | Meyer |
| 8,793,790 B2 | 7/2014 | Khurana et al. |
| 8,818,288 B2 | 8/2014 | Patwari et al. |
| 8,836,344 B2 | 9/2014 | Habib et al. |
| 8,842,010 B2 | 9/2014 | Cehelnik |
| 8,844,038 B2 | 9/2014 | Niemela |
| 8,849,471 B2 | 9/2014 | Daniel et al. |
| 8,984,581 B2 | 3/2015 | Luna et al. |
| 9,143,413 B1 | 9/2015 | Manku et al. |
| 9,143,968 B1 | 9/2015 | Manku et al. |
| 9,144,041 B2 | 9/2015 | Curtis et al. |
| 9,185,121 B2 | 11/2015 | Chari et al. |
| 9,245,426 B2 | 1/2016 | Caicedo Fernandez et al. |
| 9,369,476 B2 | 6/2016 | Chekina et al. |
| 9,378,361 B1 | 6/2016 | Yen et al. |
| 9,407,663 B1 | 8/2016 | Pauley, Jr. et al. |
| 9,408,041 B1* | 8/2016 | Abehassera ........... H04W 4/043 |
| 9,413,839 B2 | 8/2016 | Annan et al. |
| 9,523,760 B1 | 12/2016 | Kravets et al. |
| 9,524,628 B1 | 12/2016 | Omer et al. |
| 9,584,974 B1 | 2/2017 | Omer et al. |
| 9,743,294 B1 | 8/2017 | Omer et al. |
| 9,900,794 B2 | 2/2018 | Han et al. |
| 2003/0108119 A1 | 6/2003 | Mohebbi et al. |
| 2004/0080415 A1 | 4/2004 | Sorenson |
| 2004/0196140 A1 | 10/2004 | Sid |
| 2005/0055568 A1 | 3/2005 | Agrawala et al. |
| 2005/0083199 A1 | 4/2005 | Hall et al. |
| 2006/0037077 A1 | 2/2006 | Gadde et al. |
| 2006/0217132 A1 | 9/2006 | Drummond-Murray et al. |
| 2007/0225000 A1* | 9/2007 | Cleveland ............. H04W 52/42 |
| | | 455/446 |
| 2007/0283002 A1 | 12/2007 | Bornhoevd et al. |
| 2008/0119130 A1 | 5/2008 | Sinha |
| 2008/0148398 A1 | 6/2008 | Mezack et al. |
| 2008/0240008 A1 | 10/2008 | Backes et al. |
| 2008/0303655 A1 | 12/2008 | Johnson |
| 2009/0040952 A1 | 2/2009 | Cover et al. |
| 2009/0062696 A1 | 3/2009 | Nathan et al. |
| 2009/0184804 A1 | 7/2009 | Seppa |
| 2009/0256483 A1 | 10/2009 | Gehman et al. |
| 2010/0125897 A1 | 5/2010 | Jain et al. |
| 2010/0145545 A1 | 6/2010 | Mosebrook et al. |
| 2010/0315284 A1 | 12/2010 | Trizna et al. |
| 2011/0130092 A1 | 6/2011 | Yun |
| 2011/0141647 A1 | 6/2011 | Garcia et al. |
| 2011/0153811 A1 | 6/2011 | Jeong et al. |
| 2011/0211563 A1* | 9/2011 | Herrala .................... G01S 1/68 |
| | | 370/338 |
| 2011/0309931 A1 | 12/2011 | Rose |
| 2012/0009882 A1 | 1/2012 | Patwari et al. |
| 2012/0046003 A1 | 2/2012 | Ying |
| 2012/0092060 A1 | 4/2012 | Ganesan |
| 2012/0115512 A1 | 5/2012 | Grainger et al. |
| 2012/0146788 A1 | 6/2012 | Wilson et al. |
| 2012/0181865 A1 | 7/2012 | Muthu |
| 2012/0184296 A1 | 7/2012 | Milosiu et al. |
| 2012/0207481 A1 | 8/2012 | Elberbaum |
| 2012/0207484 A1 | 8/2012 | Hunt |
| 2013/0090151 A1 | 4/2013 | Ngai et al. |
| 2013/0162459 A1 | 6/2013 | Aharony et al. |
| 2013/0175863 A1 | 7/2013 | Pan |
| 2013/0260602 A1 | 10/2013 | German et al. |
| 2013/0283256 A1 | 10/2013 | Proud |
| 2014/0004874 A1 | 1/2014 | Schwartz et al. |
| 2014/0015706 A1 | 1/2014 | Ishihara et al. |
| 2014/0128778 A1 | 5/2014 | Chan et al. |
| 2014/0135042 A1 | 5/2014 | Buchheim et al. |
| 2014/0140231 A1 | 5/2014 | Haiut et al. |
| 2014/0165207 A1 | 6/2014 | Engel et al. |
| 2014/0247179 A1 | 9/2014 | Furuskog et al. |
| 2014/0286380 A1 | 9/2014 | Prager et al. |
| 2014/0330960 A1 | 11/2014 | Haga et al. |
| 2014/0354429 A1* | 12/2014 | Henderson ............. G08B 21/22 |
| | | 340/541 |
| 2015/0005900 A1 | 1/2015 | Steele et al. |
| 2015/0022123 A1 | 1/2015 | Van De Sluis et al. |
| 2015/0043377 A1 | 2/2015 | Cholas et al. |
| 2015/0049745 A1 | 2/2015 | Han et al. |
| 2015/0049792 A1 | 2/2015 | Han et al. |
| 2015/0059248 A1* | 3/2015 | Iwata ....................... E05F 15/73 |
| | | 49/26 |
| 2015/0069242 A1* | 3/2015 | Alameh ................. G01J 1/0407 |
| | | 250/338.3 |

(56) References Cited

U.S. PATENT DOCUMENTS

| | | |
|---|---|---|
| 2015/0078295 A1 | 3/2015 | Mandyam et al. |
| 2015/0098377 A1 | 4/2015 | Amini et al. |
| 2015/0143454 A1 | 5/2015 | Lee et al. |
| 2015/0156031 A1* | 6/2015 | Fadell .............. H04L 12/2816 700/276 |
| 2015/0195100 A1 | 7/2015 | Imes et al. |
| 2015/0212205 A1 | 7/2015 | Shpater |
| 2015/0236848 A1 | 8/2015 | Ma et al. |
| 2015/0245164 A1 | 8/2015 | Merrill |
| 2015/0257167 A1 | 9/2015 | Chen et al. |
| 2015/0295808 A1 | 10/2015 | O'Malley et al. |
| 2015/0301173 A1 | 10/2015 | Vangeel et al. |
| 2015/0338507 A1 | 11/2015 | Oh et al. |
| 2016/0018508 A1 | 1/2016 | Chen et al. |
| 2016/0028763 A1 | 1/2016 | Cruz Mota et al. |
| 2016/0050182 A1 | 2/2016 | Edross |
| 2016/0050224 A1 | 2/2016 | Ricafort et al. |
| 2016/0110833 A1* | 4/2016 | Fix ..................... G06Q 50/265 705/324 |
| 2016/0183059 A1 | 6/2016 | Nagy et al. |
| 2016/0187475 A1 | 6/2016 | Horng et al. |
| 2016/0210838 A1 | 7/2016 | Yan et al. |
| 2016/0234167 A1 | 8/2016 | Engel et al. |
| 2016/0241999 A1 | 8/2016 | Chin et al. |
| 2016/0301543 A1 | 10/2016 | Minezawa et al. |
| 2016/0335861 A1 | 11/2016 | Shimura |
| 2017/0146656 A1 | 5/2017 | Belsley et al. |
| 2017/0343658 A1 | 11/2017 | Ramirez et al. |
| 2018/0026481 A1 | 1/2018 | Ku et al. |
| 2018/0131554 A1 | 5/2018 | Liu et al. |

FOREIGN PATENT DOCUMENTS

| | | |
|---|---|---|
| CN | 101184353 A | 5/2008 |
| CN | 201319687 Y | 9/2009 |
| CN | 201467534 U | 5/2010 |
| CN | 201639825 U | 11/2010 |
| CN | 201839492 U | 5/2011 |
| CN | 102131327 A | 7/2011 |
| CN | 202475882 U | 10/2012 |
| CN | 202738203 U | 2/2013 |
| CN | 202759621 U | 2/2013 |
| CN | 203241317 U | 10/2013 |
| CN | 203243557 U | 10/2013 |
| CN | 203251317 U | 10/2013 |
| EP | 1829003 B1 | 11/2013 |
| JP | 2005136532 A | 5/2005 |
| JP | 2005535950 A | 11/2005 |
| JP | 2006129098 A | 5/2006 |
| JP | 2007159370 A | 6/2007 |
| JP | 2008305800 A | 12/2008 |
| JP | 2009229318 A | 10/2009 |
| JP | 2011109784 A | 6/2011 |
| JP | 2012190161 A | 10/2012 |
| JP | 201552475 A | 3/2015 |
| JP | 2015052475 A | 3/2015 |
| JP | 2015527573 A | 9/2015 |
| JP | 2015222173 A | 12/2015 |
| JP | 2016206851 A | 12/2016 |
| KR | 100887425 B1 | 3/2009 |
| KR | 100912039 B1 | 8/2009 |
| KR | 20090113941 A | 11/2009 |
| KR | 101009613 B1 | 1/2011 |
| KR | 20130012996 A | 2/2013 |
| KR | 20130017298 A | 2/2013 |
| KR | 20140080755 A | 7/2014 |
| KR | 20140120748 A | 10/2014 |
| WO | 2011062445 A2 | 5/2011 |
| WO | 2012010170 A1 | 1/2012 |
| WO | 2014021574 A1 | 2/2014 |
| WO | 2014026226 A1 | 2/2014 |
| WO | 2014109486 A1 | 7/2014 |
| WO | 2014201574 A1 | 12/2014 |
| WO | 2015035830 A1 | 3/2015 |
| WO | 2015168700 A1 | 11/2015 |
| WO | 2017078811 A2 | 5/2017 |

OTHER PUBLICATIONS

International Search Report, International Patent Application No. PCT/US2015/058019, dated Feb. 5, 2016 (10 pages).

International Search Report, International Patent Application No. PCT/US2015/057869, dated Feb. 5, 2016 (10 pages).

International Search Report, International Patent Application No. PCT/US2016/016836, dated May 24, 2016 (12 pages).

International Search Report, International Patent Application No. PCT/US2016/045611, dated May 16, 2017, (10 pags).

Adib, Fadel et al., "See Through Walls with Wi-Fi!", ACM SIGCOMM Computer Communication Review, 2013.10, vol. 43, Issue 4, pp. 75-86 (12 pages).

Youssef, Moustafa, et al., "Challenges: Device-free Passive Localization for Wireless Environments", Mobicom 2007 Proceedings of the 13th Annual ACM International Conference on Mobile Computing and Networking, held on Sep. 9-14, 2007, in Montreal, Quebec, Canada, pp. 222-229 (8 pages).

NETGEAR®, "N600 WiFi Cable Modem Router, Model C3700 User Manual", dated Mar. 2014 (101 pages).

OPENWRT, "Wireless Configuration", https://web.archive.org/web/20140402033233/http://wiki.openwrt.org/doc/uci/wireless (capture of URL http://wiki.openwrt.org.doc/uci/wireless on Apr. 2, 2014), printed on Jan. 25, 2018 (10 pages).

Japan Radio Co., Ltd; "26GHz FWA—Technology"; http://www.jrc.co.jp/eng/product/lineup/26ghz_wireless_ip_access_system/tech.html, printed on Jan. 25, 2018 (3 pages).

Apple Insider; "Intel to reportedly supply LTE chips for 2016 iPhone"; http://appleinsider.com/articles/15/03/11/intel-to-reportedly-supply-lte-chips-for-2016-iphone, printed on Jan. 25, 2018 (9 pages).

Ceva; Ceva's DSP Cores Power the World's Leading Mobile Broadband and M2M Applications; http://www.ceva-dsp.com/Mobile-Broadband; May 15, 2016, printed on Jan. 28, 2018 (3 pages.).

quora.com; "What is the function of the baseband processor in wireless devices?"; https://www.uora.com/What-is-the-function-of-the-baseband-processor-in-wireless-devices; May 15, 2016, printed on Jan. 25, 2018 (2 pages).

Wikipedia; "Baseband processor", rhttps://en.wikipedia.org/wiki/Bandband_processor; 2 pages; version dated Apr. 19, 2016, printed on Jan. 25, 2018 (1 page).

International Search Report, International Patent Application No. PCT/US2018/047555, dated Nov. 13, 2018 (10 pages).

International Search Report, International Patent Application No. PCT/US2018/045835, dated Nov. 20, 2018 (21 pages).

* cited by examiner

DETECTING LOCATION WITHIN A NETWORK

CROSS-REFERENCE TO RELATED APPLICATIONS

This application is a continuation-in-part of U.S. Utility patent application Ser. No. 15/600,380, filed May 19, 2017, which is a continuation of U.S. Utility patent application Ser. No. 15/227,717, filed Aug. 3, 2016, and issued on Jun. 27, 2017, as U.S. Utility Pat. No. 9,693,195, which claims the benefit of U.S. Provisional Patent Application No. 62/252,954, filed Nov. 9, 2015, and U.S. Provisional Patent Application No. 62/219,457, filed Sep. 16, 2015 and which is a continuation of U.S. Utility patent application Ser. No. 15/084,002, filed Mar. 29, 2016, and issued on Oct. 18, 2016, as U.S. Utility Pat. No. 9,474,042, which applications in turn also claim benefit of the above-referenced provisional applications. The entire disclosure of all of these documents is herein incorporated by reference.

BACKGROUND

1. Field of the Invention

This disclosure is related to the field of object detection, and more particularly to systems and methods for detecting the presence of a biological mass within a wireless communications network.

2. Description of the Related Art

Tracking objects may be done using a number of techniques. For example, a moving transceiver may be attached to the object. Examples of such systems include global positioning location systems such as GPS, which use orbiting satellites to communicate with terrestrial transceivers. However, such systems are generally less effective indoors, where satellite signals may be blocked, reducing accuracy. Thus, other technologies are often used indoors, such as Bluetooth™ beacons, which calculate the location of a roaming or unknown transceiver. The roaming transceiver acts as a fiducial element.

These systems have several disadvantages, among them that the object tracked must include a transceiver. In certain applications, the object to be tracked will have no such fiducial element, or will actively disable any such element, such as an intruder in a home.

Other technologies exist which can also detect and track objects without the use of a fiducial element. For example, radar is a venerable object-detection system that uses RF waves to determine the range, angle, or velocity of objects, including aircraft, ships, spacecraft, guided missiles, motor vehicles, weather formations, and terrain. Radar operates by transmitting electromagnetic waves, generally using waves in the radio frequency ("RF") of the electromagnetic spectrum, which reflect from any object in their path. A receiver, typically part of the same system as the transmitter, receives and processes these reflected waves to determine properties of the objects. Other systems similar to radar, using other parts of the electromagnetic spectrum, may also be used in similar fashion, such as ultraviolet, visible, or near-infrared light from lasers.

Radar technologies do not require a fiducial element, but have other shortcomings. For example, radar signals are susceptible to signal noise, or random variations in the signal caused by internal electrical components, as well as noise and interference from external sources, such as the natural background radiation. Radar is also vulnerable to external interference sources, such as intervening objects blocking the beam path and can be deceived by objects of particular size, shape, and orientation.

SUMMARY

The following is a summary of the invention in order to provide a basic understanding of some aspects of the invention. This summary is not intended to identify key or critical elements of the invention or to delineate the scope of the invention. The sole purpose of this section is to present some concepts of the invention in a simplified form as a prelude to the more detailed description that is presented later.

Because of these and other problems in the art, there is described herein, among other things, is a method for detecting the presence of a human comprising: providing a first transceiver disposed at a first position within a detection area; providing a second transceiver disposed at a second location within the detection area; a computer server communicably coupled to the first transceiver; the first transceiver receiving a first set of wireless signals from the second transceiver via the wireless communications network; the computer server receiving a first set of signal data from the first transceiver, the first set of signal data comprising data about the properties of the first set of wireless signals, the property data being generated as part of ordinary operation of the first transceiver on the communication network; the computer server creating a baseline signal profile for communications from the second transceiver to the first transceiver, the baseline signal profile being based at least in part on the wireless signal properties in the received first set of signal data, and representing characteristics of wireless transmissions from the second transceiver to the first transceiver when no human is present in the detection area; the first transceiver receiving a second set of wireless signals from the second transceiver via the wireless communications network; the computer server receiving a second set of signal data from the first transceiver, the second set of signal data comprising data about the properties of the second set of wireless signals, the property data being generated as part of ordinary operation of the first transceiver on the communication network; and the computer server determining whether a human is present within the detection area, the determination based at least in part on a comparison of the wireless signal properties in the received second set of wireless signal data to the baseline signal profile.

In an embodiment of the method, the first set of signal properties comprise wireless network signal protocol properties determined by the first transceiver.

In another embodiment of the method, the wireless network signal protocol properties are selected from the group consisting of: received signal strength, latency, and bit error rate.

In another embodiment of the method, the method further comprises: providing a third transceiver disposed at a third location within the detection area; the first transceiver receiving a third set of wireless signals from the third transceiver via the wireless communications network; the computer server receiving a third set of signal data from the first transceiver, the third set of signal data comprising data about the properties of the third set of wireless signals, the property data being generated as part of ordinary operation of the first transceiver on the communication network; the computer server creating a second baseline signal profile for communications from the third transceiver to the first transceiver, the second baseline signal profile being based at least in part on the wireless signal properties in the received third set of signal data, and representing characteristics of wireless transmissions from the third transceiver to the first transceiver when no human is present in the detection area; the first transceiver receiving a fourth set of wireless signals from the third transceiver via the wireless communications network; the computer server receiving a fourth set of signal data from the first transceiver, the fourth set of signal data comprising data about the properties of the fourth set of wireless signals, the property data being generated as part of ordinary operation of the first transceiver on the communication network; and in the determining step, the computer server determining whether a human is present within the detection area based at least in part on a comparison of the wireless signal properties in the received fourth set of wireless signal data to the second baseline signal profile.

In another embodiment of the method, the determining step applies statistical methods to the second set of wireless signal data to determine the presence of a human.

In another embodiment of the method, the method further comprises: the computer server continuously determining the presence or absence of a human within the detection area, the determination based at least in part on a comparison of the baseline signal profile to signal data comprising data about the properties of the first set of wireless signals received continuously at the computer server from the first transceiver; and the computer continuously updating the baseline signal profile based on the continuously received signal data when the continuously received signal data indicates the absence of a human in the detection area.

In another embodiment of the method, the method further comprises: the computer server determining the number of humans is present within the detection area, the determination based at least in part on a comparison of the received second set of signal properties to the baseline signal profile.

In another embodiment of the method, the method further comprises: the computer server determining the location of one or more humans within the detection area, the determination based at least in part on a comparison of the received second set of signal properties to the baseline signal profile.

In another embodiment of the method, the method further comprises: the computer server being operatively coupled to a second system; and only after the computer server detects the presence of a human in the detection area, the computer operates the second system.

In another embodiment of the method, the detection network and the second system are configured to communicate using the same communication protocol.

In another embodiment of the method, the second system is an electrical system.

In another embodiment of the method, the second system is a lighting system.

In another embodiment of the method, the second system is a heating, venting, and cooling (HVAC) system.

In another embodiment of the method, the second system is a security system.

In another embodiment of the method, the second system is an industrial automation system.

In another embodiment of the method, the wireless communication protocol is selected from the group consisting of: Bluetooth™, Bluetooth™ Low Energy, ANT, ANT+, WiFi, Zigbee, Thread, and Z-Wave.

In another embodiment of the method, the wireless communication network has a carrier frequency in the range of 850 MHz and 17.5 GHz inclusive.

In another embodiment of the method, the determination whether a human is present within the detection area is adjusted based on machine learning comprising: determining a first sample location of a human having a fiducial element in the detection area, the first sample location being determined based upon detecting the fiducial element; determining a second sample location of the human in the detection area, the second sample location being determined based at least in part on a comparison of the received second set of signal data to the baseline signal profile not utilizing the fiducial element; comparing the first sample location and the second sample location; and adjusting the determination step based on non-fiducial element location to improve the location calculating capabilities of the system, the adjusting based upon the comparing step.

In another embodiment of the method, the determination whether a human is present within the detection area is adjusted based on machine learning comprising: determining based on user input or action that a human was present in an area when the sample signal properties correspond at least in part with baseline signal properties of an empty space, modifying, at least in part, the baseline signal properties for an empty space; modifying, at least in part, the signal properties associated with an occupied space; and adjusting the method for comparing sample signal properties to the baseline and other comparative signal properties to improve the accuracy of the system over time.

In an embodiment of the system, the user input or action which provides presence data is provided directly to the system in some form including, but not limited to, physical switches, smartphone input, or auditory cues.

In an embodiment of the system, the user input or action which provides presence data is provided indirectly to the system in some form, such as deliberately changing the signal profile to counteract a decision being taken by the system, such as providing such a change during a dimming phase in a lighting system.

In another embodiment of the method, the method further comprises: the computer server storing a plurality of historical data records indicative of whether a human was present in the detection area over a period of time, each of the historical data records comprising an indication of the number of humans detected in the detected area and the date and time of when the number of humans was detected in the detection area; and the computer server making the historical data records available to one or more external computer systems via an interface.

Also described herein, among other things, is a method for detecting the presence of a human comprising: providing a first transceiver disposed at a first position within a detection area; providing a second transceiver disposed at a second location within the detection area; providing a computer server communicably coupled to the first transceiver; providing a first external system operatively coupled to the computer server; providing a second external system operatively coupled to the computer server; the computer server receiving from the first transceiver a set of baseline signal data comprising property data about the signal properties of a first set of wireless signals received by the first transceiver from the second transceiver when no human is present in the detection area, the property data being generated by the first transceiver as part of ordinary operation of the first transceiver on the communication network; the computer server creating a baseline signal profile for communications from the second transceiver to the first transceiver when no human is present in the detection area, the baseline signal profile being based at least in part on the property data representing characteristics of wireless transmissions from the second transceiver to the first transceiver when no human is present in the detection area; the computer server receiving from the first transceiver a first set of sample baseline signal data comprising property data about the signal properties of a second set of wireless signals received by the first transceiver from the second transceiver when a human is present in the detection area, the property data being generated by the first transceiver as part of ordinary operation of the first transceiver on the communication network; the computer server creating a first sample baseline signal profile for communications from the second transceiver to the first transceiver when a human is present in the detection area, the first sample baseline signal profile being based at least in part on the property data in the first set of sample baseline signal data, representing characteristics of wireless transmissions from the second transceiver to the first transceiver when a human is present in the detection area; the computer server receiving from the first transceiver a second set of sample baseline signal data comprising property data about the signal properties of a third set of wireless signals received by the first transceiver from the second transceiver when a human is present in the detection area, the property data being generated by the first transceiver as part of ordinary operation of the first transceiver on the communication network; the computer server creating a second sample baseline signal profile for communications from the second transceiver to the first transceiver when a human is present in the detection area, the second sample baseline signal profile being based at least in part on the property data in the second set of sample baseline signal data, representing characteristics of wireless transmissions from the second transceiver to the first transceiver when a human is present in the detection area; the computer server receiving from the first transceiver a third set of sample baseline signal data comprising property data about the signal properties of a fourth set of wireless signals received by the first transceiver from the second transceiver when a human is present in the detection area, the property data being generated by the first transceiver as part of ordinary operation of the first transceiver on the communication network; the computer server determining to operate the first external system based upon the computer server determining that the property data in the third set of sample baseline signal data corresponds to the first sample baseline signal profile; the computer server determining not to operate the second external system based upon the computer server determining that the property data in the third set of sample baseline signal data does not correspond to the second sample baseline signal profile.

In an embodiment of the method, the determination to operate the first external system and the determination not to operate the second external system is adjusted based on machine learning comprising: determining a first sample location of a human having a fiducial element in the detection area, the first sample location being determined based upon detecting the fiducial element; determining a second sample location of the human in the detection area, the second sample location being determined based at least in part on a comparison of the received second set of signal data to the baseline signal profile not utilizing the fiducial element; comparing the first sample location and the second sample location; and adjusting the determination steps based on non-fiducial element location to improve the location calculating capabilities of the system, the adjusting based upon the comparing step.

In another embodiment of the method, the determination to operate the first external system and the determination not to operate the second external system is adjusted based on machine learning comprising: determining a first sample location of a human in the detection area using inference, the first sample location being determined based upon detecting the human interacting with the system in some known way; determining a second sample location of the human in the detection area, the second sample location being determined based at least in part on a comparison of the received second set of signal data to the baseline signal profile not utilizing the inferred location; comparing the first sample location and the second sample location; and adjusting the determination steps based on inferred location to improve the location calculating capabilities of the system, the adjusting based upon the comparing step.

In another embodiment of the method, the property data about the wireless signals comprises data about signal properties selected from the group consisting of: received signal strength, latency, and bit error rate.

In another embodiment of the method, the computer server creates the first sample baseline signal profile by applying statistical methods to the first set of sample baseline signal data, and the computer server creates the second sample baseline signal profile by applying statistical methods to the second set of sample baseline signal data.

In another embodiment of the method, the method further comprises: the computer server receiving from the first transceiver additional sets of baseline signal data comprising property data about the signal properties of a second set of wireless signals received by the first transceiver from the second transceiver, the property data being generated by the first transceiver as part of ordinary operation of the first transceiver on the communication network and the computer server updating the baseline signal profile based on the continuously received additional sets of baseline signal data when the continuously received sets of baseline signal data indicate the absence of a human in the detection area.

In another embodiment of the method, the method further comprises: the computer server receiving from the first transceiver a set of signal data comprising property data about the signal properties of a second set of wireless signals received by the first transceiver from the second transceiver when one or more humans are present in the detection area, the property data being generated by the first transceiver as part of ordinary operation of the first transceiver on the communication network; the computer server determining the quantity of humans present in the detection area based at least in part on a comparison of the set of signal data to the baseline signal profile.

In another embodiment of the method, the method further comprises: the computer server determining a location of each of the one or more humans present in the detection area, the determination based at least in part on a comparison of the set of signal data to the baseline signal profile.

In another embodiment of the method, when a human is present in the detection area, the computer server determines that a human is present in the detection area and operates the first external system even if the property data in the third set of sample baseline signal data corresponds to the second sample baseline signal profile.

In another embodiment of the method, when a human is present in the detection area, the computer server determines that a human is present in the detection area and operates the second external system only if the property data in the third set of sample baseline signal data corresponds to the second sample baseline signal profile.

In another embodiment of the method, the wireless communication network has a carrier frequency in the range of 850 MHz and 17.5 GHz inclusive.

In another embodiment of the method, the method further comprises: the computer server storing a plurality of historical data records indicative of whether a human was present in the detection area over a period of time, each of the historical data records comprising an indication of the number of humans detected in the detected area and the date and time of when the number of humans was detected in the detection area; and the computer server making the historical data records available to one or more external computer systems via an interface.

DESCRIPTION OF THE PREFERRED EMBODIMENT

Figure 1:
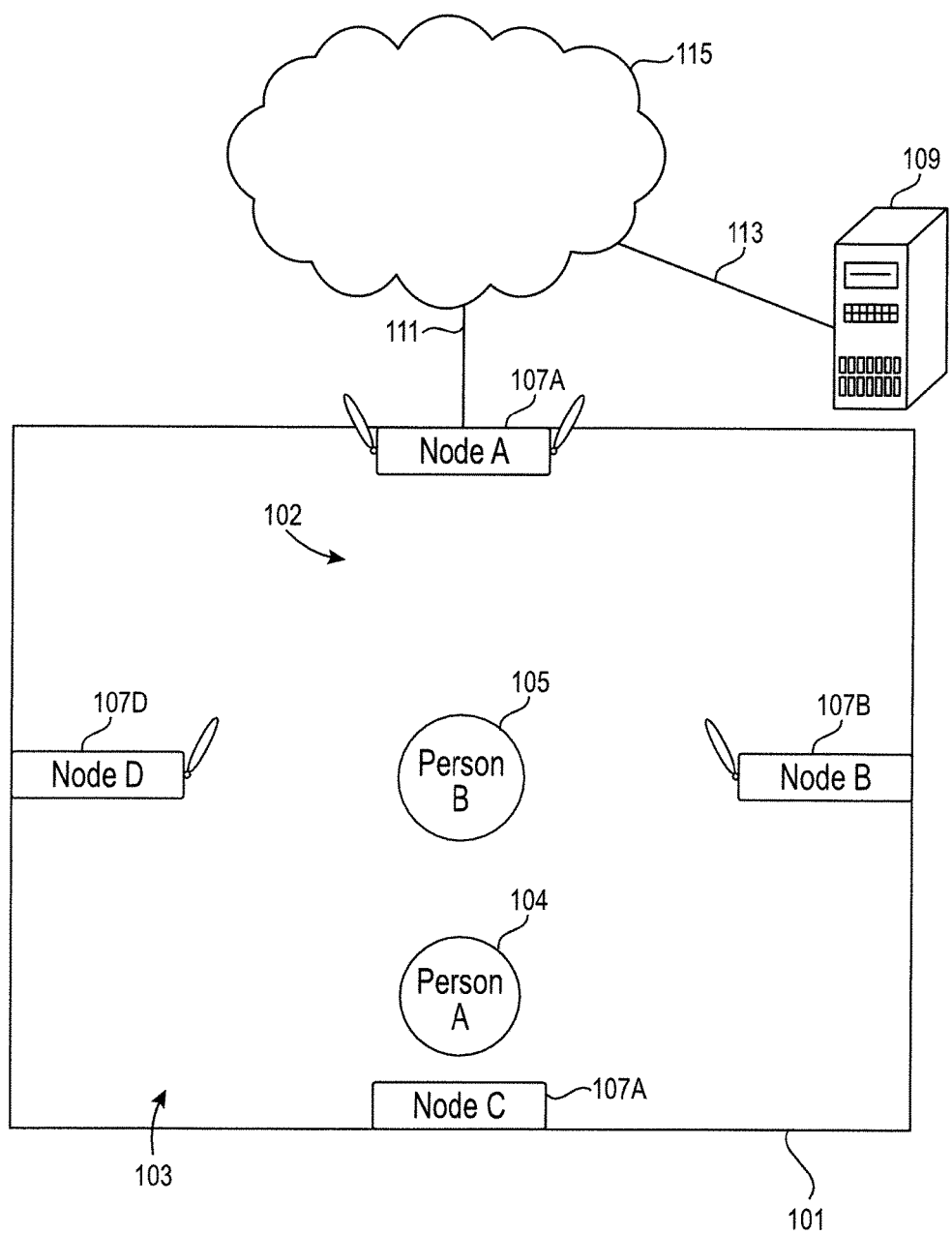
FIG. 1 is a schematic diagram of an embodiment of a system according to the present disclosure.

The following detailed description and disclosure illustrates by way of example and not by way of limitation. This description will clearly enable one skilled in the art to make and use the disclosed systems and methods, and describes several embodiments, adaptations, variations, alternatives and uses of the disclosed systems and methods. As various changes could be made in the above constructions without departing from the scope of the disclosures, it is intended that all matter contained in the description or shown in the accompanying drawings shall be interpreted as illustrative and not in a limiting sense.

Generally speaking, described herein, among other things, are systems and methods for detecting the presence of a body in a network without fiducial elements. Generally speaking, the systems and methods described herein use signal absorption, and signal forward scatter and reflected backscatter of the RF communication caused by the presence of a biological mass in a communications network, generally a mesh network.

Throughout this disclosure, the term "computer" describes hardware which generally implements functionality provided by digital computing technology, particularly computing functionality associated with microprocessors. The term "computer" is not intended to be limited to any specific type of computing device, but it is intended to be inclusive of all computational devices including, but not limited to: processing devices, microprocessors, personal computers, desktop computers, laptop computers, workstations, terminals, servers, clients, portable computers, handheld computers, smart phones, tablet computers, mobile devices, server farms, hardware appliances, minicomputers, mainframe computers, video game consoles, handheld video game products, and wearable computing devices including but not limited to eyewear, wrist-wear, pendants, and clip-on devices.

As used herein, a "computer" is necessarily an abstraction of the functionality provided by a single computer device outfitted with the hardware and accessories typical of computers in a particular role. By way of example and not limitation, the term "computer" in reference to a laptop computer would be understood by one of ordinary skill in the art to include the functionality provided by pointer-based input devices, such as a mouse or track pad, whereas the term "computer" used in reference to an enterprise-class server would be understood by one of ordinary skill in the art to include the functionality provided by redundant systems, such as RAID drives and dual power supplies.

It is also well known to those of ordinary skill in the art that the functionality of a single computer may be distributed across a number of individual machines. This distribution may be functional, as where specific machines perform specific tasks; or, balanced, as where each machine is capable of performing most or all functions of any other machine and is assigned tasks based on its available resources at a point in time. Thus, the term "computer" as used herein, can refer to a single, standalone, self-contained device or to a plurality of machines working together or independently, including without limitation: a network server farm, "cloud" computing system, software-as-a-service, or other distributed or collaborative computer networks.

Those of ordinary skill in the art also appreciate that some devices which are not conventionally thought of as "computers" nevertheless exhibit the characteristics of a "computer" in certain contexts. Where such a device is performing the functions of a "computer" as described herein, the term "computer" includes such devices to that extent. Devices of this type include but are not limited to: network hardware, print servers, file servers, NAS and SAN, load balancers, and any other hardware capable of interacting with the systems and methods described herein in the matter of a conventional "computer."

Throughout this disclosure, the term "software" refers to code objects, program logic, command structures, data structures and definitions, source code, executable and/or binary files, machine code, object code, compiled libraries, implementations, algorithms, libraries, or any instruction or set of instructions capable of being executed by a computer processor, or capable of being converted into a form capable of being executed by a computer processor, including without limitation virtual processors, or by the use of run-time environments, virtual machines, and/or interpreters. Those of ordinary skill in the art recognize that software can be wired or embedded into hardware, including without limitation onto a microchip, and still be considered "software" within the meaning of this disclosure. For purposes of this disclosure, software includes without limitation: instructions stored or storable in RAM, ROM, flash memory BIOS, CMOS, mother and daughter board circuitry, hardware controllers, USB controllers or hosts, peripheral devices and controllers, video cards, audio controllers, network cards, Bluetooth™ and other wireless communication devices, virtual memory, storage devices and associated controllers, firmware, and device drivers. The systems and methods described here are contemplated to use computers and computer software typically stored in a computer- or machine-readable storage medium or memory.

Throughout this disclosure, terms used herein to describe or reference media holding software, including without limitation terms such as "media," "storage media," and "memory," may include or exclude transitory media such as signals and carrier waves.

Throughout this disclosure, the term "network" generally refers to a voice, data, or other telecommunications network over which computers communicate with each other. The term "server" generally refers to a computer providing a service over a network, and a "client" generally refers to a computer accessing or using a service provided by a server over a network. Those having ordinary skill in the art will appreciate that the terms "server" and "client" may refer to hardware, software, and/or a combination of hardware and software, depending on context. Those having ordinary skill in the art will further appreciate that the terms "server" and "client" may refer to endpoints of a network communication or network connection, including but not necessarily limited to a network socket connection. Those having ordinary skill in the art will further appreciate that a "server" may comprise a plurality of software and/or hardware servers delivering a service or set of services. Those having ordinary skill in the art will further appreciate that the term "host" may, in noun form, refer to an endpoint of a network communication or network (e.g., "a remote host"), or may, in verb form, refer to a server providing a service over a network ("hosts a website"), or an access point for a service over a network.

Throughout this disclosure, the term "real time" refers to software operating within operational deadlines for a given event to commence or complete, or for a given module, software, or system to respond, and generally invokes that the response or performance time is, in ordinary user perception and considered the technological context, effectively generally cotemporaneous with a reference event. Those of ordinary skill in the art understand that "real time" does not literally mean the system processes input and/or responds instantaneously, but rather that the system processes and/or responds rapidly enough that the processing or response time is within the general human perception of the passage of real time in the operational context of the program. Those of ordinary skill in the art understand that, where the operational context is a graphical user interface, "real time" normally implies a response time of no more than one second of actual time, with milliseconds or microseconds being preferable. However, those of ordinary skill in the art also understand that, under other operational contexts, a system operating in "real time" may exhibit delays longer than one second, particularly where network operations are involved.

Throughout this disclosure, the term "transmitter" refers to equipment, or a set of equipment, having the hardware, circuitry, and/or software to generate and transmit electromagnetic waves carrying messages, signals, data, or other information. A transmitter may also comprise the componentry to receive electric signals containing such messages, signals, data, or other information, and convert them to such electromagnetic waves. The term "receiver" refers to equipment, or a set of equipment, having the hardware, circuitry, and/or software to receive such transmitted electromagnetic waves and convert them into signals, usually electrical, from which the message, signal, data, or other information may be extracted. The term "transceiver" generally refers to a device or system that comprises both a transmitter and receiver, such as, but not necessarily limited to, a two-way radio, or wireless networking router or access point. For purposes of this disclosure, all three terms should be understood as interchangeable unless otherwise indicated; for example, the term "transmitter" should be understood to imply the presence of a receiver, and the term "receiver" should be understood to imply the presence of a transmitter.

Throughout this disclosure, the term "detection network" refers to a wireless network used in the systems and methods of the present disclosure to detect the presence of biological mass interposed within the communications area of the network. A detection network may use general networking protocols and standards and may be, but is not necessarily, a special-purpose network. That is, while the nodes in the network could be deployed for the specific purpose of setting up a wireless detection network according to the present invention, they need not be and generally will not be. Ordinary wireless networks established for other purposes may be used to implement the systems and methods described herein. In the preferred embodiment, the detection network uses a plurality of Bluetooth™ Low Energy nodes, but the present disclosure is not limited to such nodes. Each node acts as a computer with an appropriate transmitter and receiver for communicating over the network. Each of the computers provides a unique identifier within the network whenever transmitting a message such that a receiving computer is capable of discerning from where the message originated. Such message origination information will usually be critical to the functioning of the invention as described in this detailed description. The receiving computer then analyzes the incoming signal properties, including but not limited to, signal strength, bit error rate, and message delay. The detection network may be a mesh network, which means a network topology in which each node relays data from the network.

Throughout this disclosure, the term "node" refers to a start point or endpoint for a network communication, generally a device having a wireless transceiver and being a part of a detection network. Nodes are generally standalone, self-contained networking devices, such as wireless routers, wireless access points, short-range beacons, and so forth. A node may be a general-purpose device or a special-purpose device configured for use in a detection network as described herein. By way of example and not limitation, a node may be a device having the wireless transmission capabilities of an off-the-shelf wireless networking device with the addition of specialized hardware, circuitry, componentry, or programming for implementing the systems and methods described herein; that is, for detecting significant changes to signal properties, including but not limited to, signal strength, bit error rate, and message delay. Within a detection network, each node can act as both a transmitter of signal to the network, as well as a receiver for other nodes to push information. In the preferred embodiment, the nodes utilize Bluetooth™ Low Energy (BLE) as a wireless networking system.

Throughout this disclosure, the term "continuous" refers to something happening at an ongoing basis over time, whether such events are mathematically continuous or discontinuous. The generally accepted mathematical definition of "continuous function" describes a function which is without holes or jumps, generally described by two-sided limits. The technology described herein is based upon disturbances to a telecommunications system, in which the transceivers transmit at discrete intervals, and the received raw data is taken discretely, i.e. at discrete time intervals. The resulting data is itself may be discrete in that it captures the characteristic of the system during a particular observation window (i.e., the time interval). In a physical or mathematical sense, this mechanism is essentially a set of discrete data points in time, implying a discontinuous function. However, in the context of the technology, one of ordinary skill in the art would understand a system exhibiting this type of behavior to be "continuous" given that such measurements are taken at an ongoing basis over time.

The measurable energy density signature of RF signals is impacted by environmental absorbers and reflectors. Many biological masses, such as humans, are mostly water and act as significant energy absorbers. Other attributes of people such as clothing, jewelry, internal organs, etc. all further impact the measurable RF energy density. This is particularly true where RF communication devices are transmitting over relatively short distances (e.g., less than 50 meters), such as Bluetooth™, WiFi™, 802.15.4 (Zigbee, Thread), and Z-Wave transceivers. A human who passes through the physical space of the network will cause signal absorption and disruption. Due to relative uniformity in size, density, and mass composition, human bodies can cause characteristic signal absorption, scattering, and measurable reflection. Changes in signal behavior and/or characteristics are generally referred to herein as "Artifacts." Such phenomena are particularly useful in the Industrial, Scientific, and Medical (ISM) bands of the RF spectrum, but are generally observable in bands beyond these.

In an RF communication system comprising a transmitter and receiver separated in space, signals received by the receiver from a given transmitter are made up of energy from the original transmitted message which has arrived at the receiver. Objects generally in the transmission path will affect the characteristics of ultimate signal which arrives at the receiver.

Communication systems are generally designed to handle such issues and still faithfully reproduce the message from the transmitter. Since humans generally exist, as far as RF communications are impacted, as a mass of water, one such observable difference between human presence and absence in a detection network is signal absorption by the human. Generally, the closer to the transmitter or receiver, the more significant the absorption is likely to be.

Generally, it is envisioned that humans will produce artifacts in a detection network in a somewhat predictable manner, which can be detected or identified programmatically by detection algorithms. Further, artifacts may be cross correlated across the network to determine an estimated position of the object causing the artifact. The accuracy of this estimation may vary with the algorithms chosen/constructed, and with the equipment used in the individual system.

For each given algorithm which is chosen/constructed, the system may build such detections as a combination of a baseline signal profile with no human present in the detection area and sample baseline signal data with a human present in the detection area. New incoming sample baseline signal data may be compared against both the known sample baseline signal data and the baseline signal profile to determine the presence or absence of humans in a space.

Short-range low power communication networks typically operate using signals in the 2.4 GHz frequency band, which is notable for being well-within the energy frequencies humans have been observed to absorb. As indicated, a human body physically interposed in a detection network absorbs and/or reflects at least some of the signals transmitted between and among nodes. However, other effects may also take place, such as forward and backward scattering. Utilizing the collection of data in a detection network without a human present to establish a baseline, and examining future elements of said data for statistically significant differences typically exhibited by the physical presence of one or more humans, whether or not the one or more humans is moving, the detection network makes the determination as to the presence or absence of humans within the network.

Depending on the communication network itself, hardware used, and the human, those changes may register within the network in different ways and produce different results; however, such changes are detectable. This differs from radar technologies in that detection of the object does not necessarily rely or depend upon only signal reflection, but often rather the opposite principle—signal absorption—which is detected via measurable changes in signal characteristics between a transmitter and receiver in different physical locations.

By analyzing the change in signal characteristics between nodes within the network, the position of a disruptor and—e.g., a human body—can be calculated relative to the network. Because the mere presence of the body is sufficient, this system does not necessarily include a fiducial element, and it need not rely on motion or movement. Because no fiducial element is required, the systems and methods described herein may provide an anonymous location data reporting service, allowing for the collection of data concerning traffic, travel routes, and occupancy without requiring additional components or devices to be associated with the bodies being tracked. Generally speaking, the systems and methods described herein operate in real time.

FIG. 1 is a schematic diagram of a system and method according to the present disclosure. In the depicted embodiment (101) of FIG. 1, a detection network (103) comprising a plurality of nodes (107) is disposed within a physical space (102), such as a room, corridor, hallway, or doorway. In the depicted embodiment of FIG. 1, an indoor space (102) is used, but the systems and methods described herein are operable in external environments as well. In the depicted embodiment, a node (107A) is communicably coupled (111) to a telecommunications network (115), such as an intranet, an internet, or the Internet. A server computer (109) may also be communicably coupled (113) to the telecommunications network (115) and thereby with the connected node (107A). The depicted server (109) comprises programming instructions for implementing the systems described herein, and carrying out the method steps described herein. However, in an embodiment, the functions performed by the server may be performed by one or more nodes (107) having the appropriate software/programming instructions, or being appropriately modified.

In the depicted embodiment of FIG. 1, each of the nodes (107) is communicably connected with at least one other node (107) in the detection network (103), and may be communicably connected to two or more, or all of the other nodes (107) in the detection network (103). For example, in a typical wireless network deployment strategy, a plurality of wireless access points is placed throughout the physical space (102), generally to ensure that a high-quality signal is available everywhere. These nodes (107) collectively form a detection network (103) and may transmit data to one another, or may transmit only to a router or set of routers. In the depicted embodiment of FIG. 1, node (107A) is a wireless router, and the other nodes (107B), (107C) and (107D) are wireless access points. However, this is just one possible configuration. Further, it is not necessary that any given node (107) be a particular type of wireless device. Any number of nodes (107) may comprise a router, access point, beacon, or other type of wireless transceiver. Further, any number of nodes (107) may be present in an embodiment, though a minimum of two is preferred. More nodes (107) in a space (102) increases the amount of data collected (as described elsewhere herein), thus improving the chance that a human is generally interposed between at least two nodes (107), improving the location resolution.

In the ordinary course of operation, the nodes (107) frequently send and receive wireless transmissions. For example, when a wireless router (107A) receives a data packet, the wireless router (107A) typically broadcasts a wireless transmission containing the packet. This means that any receivers within the broadcast radius of the router (107A) can receive the signal, whether or not intended for them. Likewise, when an access point receives local data, such data is likewise broadcast and can be detected by other access points, and the router. Even when no user data is actively transmitted on the network, other data is frequently transmitted. These other transmissions may include status data, service scans, and data exchange for functions of the low-level layers of the network stack.

Thus, each node (107) in a typical detection network (103) receives transmissions on a consistent basis and, in a busy network, this effectively may be a continuous basis. The detection network (103) may thus be used to calculate the existence and/or position of a biological mass (104) or (105) physically interposed within the transmission range of the network (103). Because the presence of a human body impacts the characteristics of signals transmitted between or among nodes (107) within the network (103), such presence can be detected by monitoring for changes in such characteristics. This detection may also be performed while the data in the data packets being transmitted and received is still being transmitted and received; that is, the detection is incident to ordinary data exchange between or among two or more nodes, which continues regardless of the detection. Specifically, the wireless network may operate to transfer data between nodes, while simultaneously using characteristics of how the data packets incorporating that data have been impacted by the presence of an object in the transmission path, to detect and locate the object.

In the depicted embodiment of FIG. 1, at least one node (107) monitors the communication signatures between itself (107) and at least one other node (107) for statistically significant changes in signal characteristics even while it awaits, receives, and/or transmits communications between itself and other nodes (107). The particular geometry of the physical space (102), including the presence and location of fixtures in the physical environment, generally does not impact the system because the monitoring is for statistically significant change in signal characteristics indicating or evidencing the characteristics of a human. That is, a change in signal characteristics is attributable to a change in absorbers or reflectors, like human bodies, in the physical environment or communication space covered by the detection network (103). The detection of the presence of a human within the detection network (103) may be done using statistical analysis methods on the signal, such as using sensing algorithms, as described elsewhere herein. Again, this does not require the human to be associated with a fiducial element, or in motion. Instead, the detection network (103) detects that characteristics of the network communication have changed because a new object (which is generally a human object) has been introduced in the communication space and the presence of that object has caused a change to the characteristics of the network communications, typically data packets, between nodes (107).

To detect a change, generally a baseline of signal characteristics is developed against which recently transmitted signals are compared. These characteristics are derived from typical wireless communication network diagnostic information. This baseline of signal characteristics between nodes (107) is generally established prior to the use of the detection network (103) as a detector. This may be done by operating the detection network (103) under typical or normal circumstances, that is with the detection network (103) communicating data packets, with no significant biological mass interposed in the physical broadcast space of the detection network (103). For an amount of time during such operation, signal characteristics between and/or among nodes (107) are monitored and collected and stored in a database. In an embodiment, the server (109) will receive and store such data, but in an embodiment, one or more nodes (107) may comprise hardware systems configured to receive and/or store such data.

For example, where a node (107) contains special purpose hardware and programming for use according to the present disclosure, such node (107) may store its own signal characteristic data. Such signal characteristic data may be data relating to the received energy characteristic of signals received by a particular node (107) from one or more other nodes (107). The baseline data establishes for each node (107) a signature characteristic profile, which is essentially a collection of data defining the typical and/or general characteristics of signals received by the node (107) under ordinary operating circumstances where there is no significant biological mass interposed in the detection network (103). The node (107) may have one or more of such profiles for each other node (107) from which it receives data.

In an embodiment, after the baseline signatures have been detected and collected, the detection network (103) will generally continue to operate in the same or similar fashion, but is now able to detect the presence of a biological mass. This is done by detecting and collecting additional signal characteristics, generally in real-time, as the detection network (103) operates in a normal mode of transmitting and receiving data packets. These newly generated real-time signal characteristic profiles are also generally characteristics of signals between two particular nodes (107) in the detection network (103), and thus can be compared to a corresponding baseline signal characteristic profile for the same two particular nodes (107). A statistically significant difference in certain characteristics between the two profiles may then be interpreted as being caused by the presence of a significant biological mass, such as a human.

The comparison operations may be performed by appropriate hardware in a given node (107), or the real-time signal characteristic profiles may be transmitted to a server (109) for processing and comparison. In a further embodiment, both are done so that a copy of the real-time data is also stored and accessible via the server, effectively providing a history of signal characteristic profiles.

This is because, as described herein, a biological mass interposed within the network will generally cause at least some signal characteristics between at least two nodes to change when a data packet is transmitted which intercepts and/or generally interacts with the biological mass. The degree and nature of the change generally will be related to the nature of the particular biological mass interposed (e.g., the size, shape, and composition), and its location in the network (103). For example, where a housefly flies through the detection network (103), the amount of signal change may be so minor as to be indistinguishable from natural fluctuations in signal characteristics. However, a larger mass, such as a human, may cause more substantial and statistically significant changes in signal characteristics.

Such changes may not necessarily manifest in all signal characteristic profiles for the detection network (103). For example, where the mass is interposed at the edge of the detection network (103), the nodes (107) nearest that edge are likely to experience statistically significant signal characteristic changes, whereas nodes on the opposing side of the detection network (103) (whose signals to each other do not pass through or around the biological mass), are likely to experience few or no statistically significant changes.

Thus, if the physical locations of the nodes (107) are also known, the system can determine not only that a biological mass is present in the detection network (103), but calculate an estimate of where it is located, by determining which nodes (107) are experiencing changes and calculating the magnitude of those changes.

This can be seen in the depicted embodiment of FIG. 1. In FIG. 1, assuming the presence of only one human—either A (104) or B (105)—is present at a time for simplicity, A (104) would generally have a greater impact on the signal characteristics between nodes (107C) and (107A) than between nodes (107A) and (107C). Further, A (104) would also generally have a small bidirectional effect on the signal characteristics between nodes (107B) and (107D). By contrast, B (105) would have a bidirectional impact on the signal characteristics between nodes (107A) and (107C), as well as on the signal characteristics between nodes (107B) and (107D).

While all nodes may be communicating with one another, the effects of A (104) and B (105) will generally be more negligible on communications where A (104) and/or B (105) are not generally in line with the communications path between nodes. For example, neither person (104) or (105) is likely to seriously impact transmission between nodes (107A) and (107B) because neither person (104) or (105) is in the transmission path between those nodes. However, A (104) may have an impact on transmissions between nodes (107C) and (107D).

It should be noted that the presence or absence of a biological mass within the communication area of the detection network (103) will not necessarily result in any change in data communication. It is expected that the detection network (103) will utilize its standard existing protocols, means, and methods (including all forms of retransmission and error checking) to make sure that the data in the data packets being transmitted is correctly received, processed and acted upon. In effect, the detection process of the detection network (103) is performed in addition to the standard data communication of the detection network.

It should be recognized from this that the data in the data packets being communicated by the nodes (107) in the detection network (103) generally will not be directly used to detect the biological mass within the communication area of the detection network (103). Instead, the data will simply be data being communicated via the detection network (103) for any reason and will often have nothing to do with detection of the biological mass. Further, while this disclosure generally contemplates packetized communication in the form of data packets, in an alternative embodiment, the data may be continuously communicated in a non-packetized form.

In an embodiment, in order to allow the detection network (103) to detect the presence or absence of a particular biological mass, the system includes a training aspect or step. This aspect may comprise, after the baseline is established, one or more humans are deliberately interposed in the network at one or more locations in the network, and one or more additional sets of baseline data are collected and stored. This second baseline may be used for comparison purposes to improve accuracy in detecting the size, shape, and/or other characteristics of a biological mass interposed in the network, and/or for improving the accuracy of location determination. Such training may use supervised or unsupervised learning, and/or may utilize techniques known to one skilled in the art of machine learning.

In an embodiment, a detection network (103) may use a specialized protocol comprising a controlled messaging structure and/or format, which can be controlled from one node (107) to another (107), making it simpler and easier to determine from which node (107) a message originated, and allowing for control of aspects such as the composition of the signal sent, transmitted signal strength, and signal duration. Such control further facilitates certain improvements in processing, and facilitates receivers identifying and using certain signal qualities and/or characteristics particular to the detection aspects of the network (103), which may differ from general networking aspects sharing the same network (103). With control of the message sent and received on the opposing sides of the mass being located, it is not necessary to send a signal as a scan, nor to sweep a region in space, as such functions tend to require significantly more expensive equipment than is needed for typical broadcast or directional transmission between nodes (107). Messages are generally constructed in such a way as to best produce usable data for detection algorithms which would be constructed to function best with the communication network they are being used within. Generally, such constructions still avoid the need for waveform level analysis of the signals sent by the network.

In the depicted embodiment, each node (107) generally is able to determine the origin node (107) of packets received by such node (107). Such message origination information is typically encoded within the message itself, as would be known to one skilled in communications networks. By way of example and not limitation, this may be done by examining data embedded in established protocols in the networking stack, or by examining data transmitted by the sending node (107) for the specific purpose of implementing the systems and methods described herein. Typically, each node (107) has appropriate hardware and processing capability for analyzing the messages received. While many different topologies and messaging protocols would allow for the functionality described herein, generally mesh networking topologies and communication methods will produce usable results.

Figure 2:
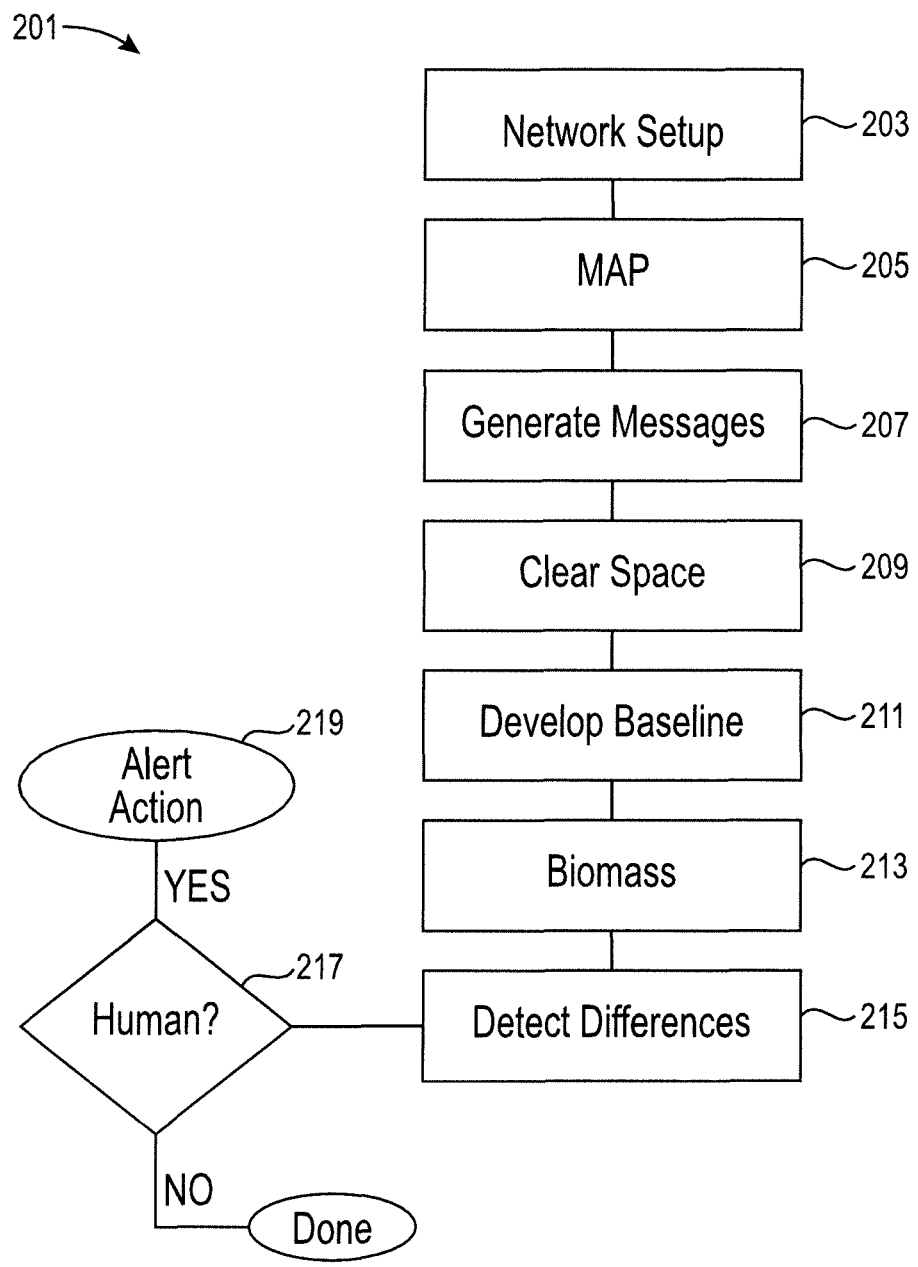
FIG. 2 is a flow chart of an embodiment of a method according to the present disclosure.

FIG. 2 depicts an embodiment (201) of a method according to the present disclosure and should be understood in conjunction with the system of FIG. 1. In the depicted embodiment, the method begins (203) with the establishment (203) of a detection network (103) comprising a plurality of communication nodes (107) according to the present disclosure. As would be known to one skilled in the art of setting up communication systems, there are many different approaches to the setup of such a network (103) and many different network (103) topologies may prove viable within this framework.

Next, a digital map in memory may be generated (205) indicating the detection network's (103) physical node (107) geometry. The detection algorithms described herein generally use information about where in the physical environment (102) the nodes (107) are deployed. Data about such physical location of the nodes (107) may be supplied manually to an accurate diagram of the physical network environment (102), and/or software could be used to automatically generate a relational position map of one or more nodes (107) within the detection network (103), facilitating easier placement of the nodes (107) into such an environment map or diagram.

Alternatively, nodes (107) may be placed on a blank or empty map or diagram using relational (as opposed to absolute) distances for detection. In such a dimensionless system, messages could still be generated from the algorithms related to the detection of humans in the system (101), and additional manual processing may be included, such as user input concerning which messages are sent related to the presence and/or movement of humans within the network (103).

In an embodiment with automatic node (107) location detection, node (107) locations are detected algorithmically and/or programmatically by one or more nodes (107) and/or a computer server (109), based upon factors such as, but not necessarily limited to: detection network (103) setup and configuration, including physical location of specific hardware components such as nodes (107) and each node's (107) location relative to one or more other nodes (107); signal strength indicators; and, transmission delay. In the depicted embodiment, this step (205) further comprises overlaying the generated map on a digital map of the physical space (102) or environment (referred to herein as an "environment map") the detection network (103) occupies, such as floor plan of a building. This step (205) may further and optionally comprise a scaling element to align the scales of the generated map to the environment map, as well as user-manipulated and/or modifiable input elements for making adjustments to fine-tune the generated map so that it more closely conforms to the actual node (107) deployment geometry, as would be understood by one of ordinary skill in the art. In an alternative embodiment, each node (107) may be manually placed in its appropriate location on the environment map without using a relative location algorithm.

Either way, this step (205) establishes the physical locations of the nodes (107) in the detection network (103), which will facilitate determination of the location of interposed biological masses attributable to the presence of humans within the detection network (103). By placing the nodes (107) on a map (either through manual or automatic means), the nodes (107) can track the presence of a human in the network (103) based on how the baseline signal affects communication between various nodes (107). The system (101) then utilizes information collected about the signals which arrive at the receivers, given a transmitted set of information known to the data processing algorithm. The data processing algorithm is what ultimately determines whether a human is present within the network (103) and/or where within the network (103) that human is located.

Next, messages are constructed and exchanged (207) in a format, and according to a protocol, determined to be suitable for detecting the presence of a biological mass within the network (103). While this may be done using general purpose networking protocols known in the art, such as protocols in the OSI network model, or special-purpose protocols which replace, or supplement, such general-purpose protocols.

Generally, it preferred that this step further comprise controlling and/or modifying (207) messages passed within the detection network (103) for the specific purpose of detecting human presence and facilitating simplified statistical analysis. By controlling (207) message exchange, the system (101) can adjust for a common content being sent through the detection network (103) while also facilitating adjustment of parameters including, but not necessarily limited to: transmission intervals; transmission power; message length and/or content; and, intended message recipient(s). Again, the system does not necessarily rely on waveform level analysis, allowing operation within the confines of wireless communication standards.

Controlling (207) such parameters facilitates the development of statistics and/or analytics, which may be based at least in part on pre-defined or anticipated message content or characteristics. Such content and/or characteristics may include, without limitation, transmission timestamp and/or transmission power level. By controlling and modifying (207) these aspects, one may overcome hardware limitations, including hardware features which cause unwanted consequences when used in a detection network (103) according to the presence disclosure, such as but not necessarily limited to automatic gain control (AGC) circuits, which may be integrated into certain receiver hardware in a node (107).

Next in the depicted embodiment (201), the space (102) is cleared (209) of significant biological mass—notably humans (205). Then, a statistical baseline of signal strength is developed (211) locally by each node (107). Again, by placing the nodes (107) on a map in step (205), whether through manual and/or automatic means, the nodes (107) can track the presence of a human in the network (103) based on how the baseline signal is affected for communication between nodes (107).

Next, a biological mass enters (213) the detection network (103), causing signal absorption and other distortions, which manifest in changes in signal characteristics between nodes (107). These changes are detected (215) and analyzed (217) to determine whether the changes are indicative of the presence of a human, or of another type of biological mass the detection network (103) is configured to detect. Such detections are further localized at least to an area between nodes, such as within an interior area between three nodes on the network, but possibly with greater accuracy depending on the algorithms and hardware being in use at the time.

Generally, this is done using detection algorithms executed either by one or more nodes (107) or by a server computer (109). The nodes (107) and/or server (109) use software to estimate the location of the detected biological mass in the detection network (103) using one or more detection algorithms. Such algorithms generally compare the baseline profile to newly detected signals, and may also use or be based upon various data and other aspects, such as, without limitation: detection network (103) setup and configuration, including physical location of specific hardware components such as nodes (107) and each node's (107) location relative to one or more other nodes (107); signal strength indicators; and, transmission delay.

Generally speaking, as described elsewhere herein, these algorithms include comparing newly gathered signal characteristic profiles (215) to baseline signal characteristic profiles (211) to identify a change and determine whether, based on the nature of the change, the change is indicative of the presence of a human. This determination may be done at least in part using training data developed through machine learning as described elsewhere herein.

In an embodiment, the detection algorithms may further comprise the use of observed signal characteristic change(s) between one or more pairs of nodes (107) in the detection network (103), correlated in time and relative effect. These factors facilitate the identification of a physical location in the detection network (103) where such a signal change took place, allowing for an estimate of the physical location of the human causing such signal characteristic change(s), which in turn may be used to estimate a physical location in the detection network (103) environment where the biological mass is interposed. Such physical location may be provided as simple x, y, z coordinates according to a coordinate system, or may be visually indicated, such as on the map.

Where multiple humans are present in the detection network (103), separating out the impact of the various individuals from one another is more difficult, and accuracy will generally improve with the addition of more nodes (107). In an embodiment, techniques such as advanced filtering and predictive path algorithms may be used to separately determine location of individuals within the network (103). Although movement of the human in the network (103) is not required for the systems and methods to operate properly, movement, or lack of movement, may be used to improve detection accuracy, such as by predicting the path of a single individual. This can help identify instances where an individual has, statistically, "disappeared" from the detection network (103) but the system has sufficient data to estimate that the individual is still present in the network (103).

For example, where an individual's movement path has been predicted, and terminates next to another detected individual, the system (101) may determine that the two individuals are too close together for signal characteristic profile changes to separately identify them, but since the individual's movement path was not determined to have taken the individual out of the network's (103) detection range, the algorithm determines that the individual is present, and not moving, in close proximity to another detected human. Thus, when one of the two proximate, stationary humans moves, the algorithms may again separately identify each one, and resume predicting path based on observed signal characteristic profile changes.

In this way, the systems and methods according to the present disclosure can track one or more individual humans within a network (103), whether or not moving, and whether or not any such humans are associated with a fiducial element. Identifying specific individuals may further be done using other path prediction and sensing algorithms, such as but not necessarily limited to those used in the robotics industry for human-following technology, in order to estimate which human was which. It should be noted that individuals may impart specific and unique effects on various signal characteristics, allowing for the identification of a specific individual, and further allowing for one specific individual to be distinguished from others. Such effects may be used to further determine the location of specific individuals within the detection network.

The detection algorithm(s) are generally constructed to take advantage of the characteristics of communication signals, considering factors such as, but not necessarily limited to, frequency of the signal(s) and the transmitted power levels of the signal(s). In an embodiment, the algorithms detect human presence using data-driven methods for determining the effect of the presence of a human on signal characteristics in the RF environment within the communication network, and then identifying when that effect is later observed.

For example, in an embodiment, a signal characteristic which varies with the presence of a human body is the signal strength registered between nodes (107). This is particularly the case within a BLE network, and the statistics related to signal strength over time may indicate the presence of a human within the network. These artifacts may be used by the detection algorithm(s) to provide information about the physical location of the object causing the artifact. That is, by combining various statistics about artifacts captured across the network (103), the system determines where in physical space (102) the artifact is located, and thus where a human is in the network (103).

In the simplest use case, the algorithms may simply identify changes in signal characteristics which are similar to changes known (e.g., from training) to be caused by the presence of a human, and simply trigger a detection event (219) whenever such changes relative to a baseline are detected. This may appear like an adjustment of mean, standard deviation, skewness, or variance in the signal strength depending on the system (101) used. When the detected signal characteristic profile returns to a profile similar to the baseline, it can be inferred that the physical environment (102) has returned to an empty state with respect to whether a human is present.

Elaborating on the simplest use case, the baseline profile in this case comprises some or all baseline profiles which exist when a space does not contain any humans, and may vary depending on physical adjustments to that space. Simpler algorithms, which may account for the changes associated with a newly detected human change relative to a recent baseline, can be used to address such situations; however, in the event that the baseline has changed, it is preferred that the system accurately determine whether one or more current signal profiles matches an empty baseline profile, or matches a profile one that represents some degree of occupancy. Such determinations may be made in response to movement, but it is preferred that they be not made in response to movement, but rather based on whether the characteristics of such a signal can be correlated with one or more of the empty baselines or one or more of the presence signal profiles.

Compared to other technologies used for such determinations (typically the Passive Infrared (PIR) Sensor), which require motion to function, the systems and methods described herein are capable of detecting the presence of a static human within a space (102), whether or not in motion, and more precisely, detecting when a human is no longer in the space (102). For applications such as security and occupancy sensing, this system would be more difficult to trick. Some examples of tricks that may fool PIR and other similar motion based technologies include holding a sheet in front of a person while they enter a space, moving very slowly, or remaining generally motionless in an area after entering. Another benefit is that the system does not necessarily require additional hardware beyond that used in ordinary network communications. This is because the additional software and processing capability may be provided via external components or modifications to existing hardware, such as by implementing the appropriate software as a System On a Chip (SOC) attached to off-the-shelf communications modules. If additional processing power is required, additional processing node(s) may be added to analyze the signals propagated between nodes (107), or the workload may be transmitted to and handled by a dedicated server machine (109).

Making determinations of human presence and/or location may be related to the particulars of the signal type being analyzed, and controlling the signal sent between nodes (107) on the network (103) to best achieve those detections. By sending controlled communication pulses through the network (103) where the original signal is known and the transmitted power can be modulated, it is possible to develop exemplary data related to signal absorption, reflection, backscatter, etc. due to additional humans between the nodes (107). Since it is generally assumed that a baseline system can be configured without the presence of a human and that such a baseline would look statistically different than with a human present, it can further be assumed that signal characteristic changes would be due to the presence of a human in the network. By allowing for the input of timers and generally configuring the system to refine the baseline definition when a space (102) is empty, the system may recalibrate itself periodically to achieve improved accuracy. Generally speaking, tracking algorithms make use of the best available triangulation calculations combined with statistical methods, as would be known to one skilled in the art of location technologies, coupled with the detection algorithms for detecting humans within the network (103).

The present disclosure does not require a fiducial element associated with the human detected, nor does it require that the human be carrying any device capable of communicating with the network; however, such technology would take advantage of such elements should they be deployed within the system. The addition of such elements may ease the calculation burden on the system and allow for increased accuracy. The systems and methods described herein do not preclude such additional functionality, and could be enhanced by it. Augmenting detection with an inference engine adds to the ability of the sensing hardware to recover from a false alarm situation or other edge case, thereby making the system more robust. Such an inference engine may further feed information into a machine learning system, which may further modify the one or more baseline signal profiles or the one or more presence signal profiles to improve the performance of the system.

In an embodiment, a detection network (103) implementing the systems and methods described herein may further comprise elements for taking action (219) based on the detected presence and/or location of a human. This may be done, for example, by sending control signals over the network using the computers to first determine the presence and/or location of a human on the network, and then to determine an action to take based on the presence and/or location of a human on the network, and to send a message over that network to take that action. Since the communication network and the network performing the detection may be the same network, the invention described herein extends the traditional functionality of a communication network to include human detection and/or location sensing without requiring additional sensing hardware.

The computer elements on the network necessarily perform additional calculations and may craft communication signals. This may ease the calculation burden on the computers; however, the network may still function as a command and control network, independently of the network as a detection network.

The system as a whole can be used for a wide variety of applications, ranging from occupancy sensing, as might be used for lighting control and/or security, to counting the number of people in a space as might be needed for a heat and/or traffic map, to a system that tracks individual humans moving through a space. The technology may be integrated into the network nodes themselves, or may be a combination of nodes transmitting information to a processing element (either directly on the network or in the cloud) to perform the calculations to determine the desired information. The final integrated product suite may be customized for an application, and could be used in a variety of different ways.

No additional sensor is required (though, in an embodiment, one may be present), and the detections are effectively made through calculating statistics from the traditional RF communication stack. Such a system prevents the collection of personal data from the people walking through the space as the system only knows that an approximately human-sized mass of water, organs, clothing, etc. has passed through, and does not require any separate device to act as a fiducial element. As such, the technology represents a significant departure from traditional methods for tracking humans moving through a space.

A logical extension of the systems and methods described herein comprises dynamically handling functional network messages within the statistical analysis so as to avoid or reduce additional messaging overhead for the system. It is also contemplated that, in an embodiment, the systems and methods described herein are extended to comprise dynamic adjustments to network and/or message structure, configuration, and/or operating parameters based at least in part on functional messages transmitted within the network.

Further, because the tracking is based on signals being affected by what is generally a human mass, the system is not reliant on the human moving around for detections. By not relying on movement, many of the shortfalls with traditional presence sensing technologies, such as passive infrared and ultrasonic sensing technology, are overcome.

The utilization of a communication network's signals between nodes to detect the presence of humans in the network where the human does not carry a fiducial element is a radical departure from current non-fiducial element detection methods and makes use of communication networks to perform presence sensing in an entirely new way. The combination of detection techniques and utilization of network nodes as transmitter receiver combinations for the purposes of performing human presence detection presented herein constitute a new type of human presence detection system which does not require additional equipment beyond that which is required to form the communication network itself.

The systems and methods described herein may be implemented in a communication network without influencing the operation of the network itself for purposes of ordinary communication. The network continues to operate as a communications network as its primary function, but some of the communications are used in this case to calculate the position of a human existing in the network. Because the systems and methods described herein utilize basic operations of a network, a human within the network additionally carrying a transceiver device known to the network may be detected and located with increased accuracy. Such a transceiver device, which may comprise, for example, a mobile computing device having a wireless transceiver, such as a cell phone, mobile phone, smart phone, tablet computer, wearable computer technology, and so forth, may connect to the network and be locatable by the network using traditional triangulation methods known to one skilled in the art. Machine learning algorithms may also be applied when a person carries such a transceiver, which may in turn further improve performance.

The location calculation of a known transceiver device may be compared with the location of the person as determined by the non-transceiver aspects described herein. With the communications network reporting both the location of the fiducial element as well as the human within the network, the locations of those two can be compared. Since it is generally the case that the detected location of a fiducial element has a higher degree of fidelity than the estimated location of the human based on network communications alone, the location calculations for the position of the human within the network can be adjusted using machine learning algorithms so as to improve the location calculation capabilities of the system for the next human entering the network.

Using machine learning algorithms, the system can improve the accuracy of location predicting algorithms based on the known location from the transceiver. This may allow for verification of prior determinations, and refining of future determinations. For example, if it is found that prior determinations are consistently off by about the same amount, that amount may be applied to future determinations as an adjustment. In this way, the system can continue to improve and train itself to better locate the humans within the network. Similarly, machine learning can continue to improve the detection and false alarm rate. By way of example and not limitation, data concerning prior traffic patterns at a facility can be used to establish defaults, presumptions, or expectations concerning the range of times or days during which a particular facility is generally occupied or generally empty. Such data can be used by the system to improve its performance.

Additionally, the system is configured to make or draw inferences, such as based upon physical interactions with network elements; that is, devices or components attached to or communicating with the network that are operable by or operate based upon the presence of a human, such as network-operable electrical switches, doors, motion sensors, infrared sensors, and the like. Such physical interactions may be considered fiducial elements at the point in time that they are interacted with for the purposes of the system. As an example, if a light switch that is part of the network is actuated, the system may infer that a human was present at or near the physical location of the switch at the time the switch was actuated. As such, the system could use that information as a known data point (i.e., examining signal characteristics of the various network devices at that point of time with the inferred knowledge that those characteristics reflect a human at a particular location near the switch) to which it could apply machine learning to better make predictions of human presence in the future. Additionally, such events could serve as presence triggers for other purposes such as security alerts. As an example, say that the system is in a security mode and someone has found a way to mask their presence but still interacts with a switch, then the system would be able to determine that someone was present and send an alert based on the interaction with the switch. Generally speaking, interactions with the system would be defined both physically and logically where logical interaction would include typical usage patterns based on time, outside inputs, etc. Such a system serves as backup to the RF presence sensing and provides additional machine learning capabilities to the system.

Additionally, the system can estimate whether a mobile transceiver in the network is actually being carried by a human or not, such as where a human leaves a device in a location in the network. Because the system can detect the human as a biomass through changes in signal characteristics, the system can detect whether a transceiver is present in the network while a human biomass is not. This inhibits false training of the system and facilitates the avoidance of baseline and presence signal profiles being corrupted by data not correlated with such profiles.

In an embodiment, as a further input to the inference engine, if some indication of the system changes states, and a human within the detection area behaves in such a manner as to correct the system state, the system may infer that it should adjust its baseline and presence profiles to better reflect user preferences. By way of example, if the lights in a space were to turn off with a human in the space, said human may engage in behavior to reflect presence, such as physically moving, waving arms, and so forth, or simply looking for or walking towards a wall switch. This movement may be detected within some reasonable amount of time, and the system may determine that it incorrectly determined that the space was absent, and adjust its baseline and presence profiles accordingly. Such activities may be referred to as inferring the presence of one or more humans in a space.

As a side effect of collecting various signal characteristics and being capable of running them through various algorithms, the system is capable of running multiple detection calculations simultaneously to achieve different performance criteria with the same system. As an example, the same communication network can be used for detections associated with lighting and security; however, the gathered statistics can be processed differently, but simultaneously, for the two applications. In this way, the lighting application can still provide for a shorter time to detect, but with a potentially higher false alarm rate, while a security application can trade a slightly longer time to detect while reducing the false alarm rate. The signal characteristics to be processed by the system may vary by application, but all are captured from the communication network and can be processed in multiple ways simultaneously. Such processing methods may be encapsulated in multiple sets of different sample baseline signal data for determining detections relative to a baseline signal profile.

In an embodiment of a system according to the present disclosure, the system comprises a communication system which is capable of determining the presence of one or more humans from information about the wireless signals between two or more computers on the network where each computer consists of: a transceiver for communication; and a computing element for performing calculations, where each computer sends signals to one or more other computers on the network where the signal includes a unique identifier of the computer sending the signal; where each computer processes the signals received for the purposes of determining the presence of one or more humans; and where the one or more humans are not required to have on their person any device capable of communicating with the network.

In an embodiment of such a system, the algorithms use statistical methods to determine the presence of one or more humans. In a further embodiment of such a system, the statistical methods determine the number of people present. In another further embodiment of such a system, the system is capable of determining the physical location of the one or more humans on the network. In a still further embodiment of such a system, the system is capable of tracking the physical location of the one or more humans over time. In another further embodiment of such a system, the system uses information about the presence of one or more humans to control devices on the network. In an embodiment, the network is a mesh network.

In an embodiment, the computers determine their relative physical locations and further determine the relative physical location of the one or more humans on the network. In a further embodiment, statistical methods are applied to a measure of signal strength to determine the presence of a human. In a further embodiment, the transmitted signal is controlled for making detecting human presence easier. In a further embodiment, the power level of the transmitted signal is controlled for making human presence easier. In a further embodiment, the system functions as an occupancy sensing system. In a further embodiment, the occupancy sensing system controls a lighting system. In a further embodiment, the network for controlling the lighting system and the network used for occupancy sensing utilize the same communications technology and hardware. In a further embodiment, the communications technology employed by the computers is chosen from the list of: Bluetooth™ Low Energy, WiFi, Zigbee, Thread, and Z-Wave.

In a further embodiment, the system functions as a sensing system for a security application. In a further embodiment, the security sensing system controls the security system. In a further embodiment, the network for controlling the security system and the network used for security sensing utilize the same communications technology and hardware. In a further embodiment, the system functions as a human detector for robotic systems. In a further embodiment, the robotic systems have computers which locate various elements of the robotic system relative to one another dynamically. In a further embodiment, the network for controlling the robotic systems and the network for functioning as the human detector for the system utilize the same communications technology and hardware.

In a further embodiment, the system functions as a sensing system for a HVAC application. In a further embodiment, the HVAC sensing system controls the HVAC system. In a further embodiment, the network for controlling the HVAC system and the network used for HVAC sensing utilize the same communications technology and hardware.

In another embodiment, the system uses machine learning to improve its detection capabilities where humans which have a fiducial element on their person train the system through: (1) using known location techniques to determine the location of the fiducial element; (2) using the system described above to locate the person; (3) comparing the location calculated by the method of (1) of this paragraph to the method of (2) of this paragraph; (4) adjusting the location determining methods using machine learning algorithms to improve the location calculating capabilities of the system.

In another embodiment, the system may infer the presence of humans in the network based on those humans interacting in some way with one or more of the computers on the network. In a further embodiment, the system may use the inferred presence of a human as an input for machine learning to improve its detection capabilities.

In an embodiment of a system according to the present disclosure, the system comprises a communication system which is capable of determining the presence, both static and moving, of one or more humans from information about the signals between two or more computers on the network where each computer consists of: a transceiver for communication; and a computing element for performing calculations, where each computer sends signals to one or more other computers on the network where the signal includes a unique identifier of the computer sending the signal; where each computer processes the signals received for the purposes of determining the presence of one or more humans; where the one or more humans are not required to have on their person any device capable of communicating with the network.

In an embodiment, the algorithms use statistical methods to determine the presence of one or more humans. In another embodiment, the statistical methods determine the number of people present. In another embodiment, the system is capable of determining the physical location of the one or more humans on the network. In another embodiment, the system is capable of tracking the physical location of the one or more humans over time. In another embodiment, the system uses information about the presence of one or more humans to control devices on the network. In another embodiment, the information about the presence of one or more humans is made available to one or more systems not directly involved in the determination of presence. In another embodiment, the system has the ability to perform self-optimization to achieve a given performance according to one or more preset criteria.

In another embodiment, the communications protocols or network is generally defined by a standards committee including but not limited to protocols such as Bluetooth™ Low Energy, WiFi, Zigbee, Thread, and Z-Wave. In another embodiment, statistical methods are applied to a measure of received signal strength to determine the presence of a human. In another embodiment, the transmitting and receiving devices on the network may be selected and actuated by the system for the purpose of making human detection easier. In another embodiment, the power level of the transmitted signal may be controlled for making human presence easier. In another embodiment, the system functions as an occupancy sensing system for a lighting system. In another embodiment, the occupancy sensing system controls a lighting system. In another embodiment, the network for controlling the lighting system and the network used for occupancy sensing utilize the same communications technology and hardware.

In another embodiment, the system functions as a sensing system for a security application. In another embodiment, the security sensing system controls the security system. In another embodiment, the network for controlling the security system and the network used for security sensing utilize the same communications technology and hardware. In another embodiment, the system functions as an occupancy sensor for a Heating, Venting, and Cooling (HVAC) system. In another embodiment, the occupancy sensing system controls the HVAC system. In another embodiment, the network for controlling the HVAC system and the network used for occupancy sensing utilize the same communications technology and hardware.

In another embodiment, the system uses machine learning to improve its detection capabilities where humans which have a fiducial element on their person train the system through: (1) using known location techniques to determine the location of the fiducial element; (2) using the system to locate the person; (3) comparing the location calculated by (1) of this paragraph to (2) of this paragraph; (4) adjusting the location determining methods using machine learning algorithms to improve the location calculating capabilities of the system.

In another embodiment, the system may infer the presence of humans in the network based on those humans interacting in some way with one of the computers on the network. Said interactions may be direct physical interactions or indirect interaction in response to some change of state in the system (e.g., waving arms in response to lights turning off). In another embodiment, the system may use the inferred presence of a human as an input for machine learning to improve its detection capabilities.

Also described herein is a communication system which is capable of determining the presence, both static and moving, of one or more humans in a detection network based on information about the signals between two or more computers on the network where each computer consists of: a transceiver for communication; and, a computing element for performing calculations, where each computer sends signals to one or more other computers on the network where the signal includes a unique identifier of the computer sending the signal; where each computer will process the signals received for the purposes of determining the presence of one or more humans in two or more ways to achieve different performance criteria as required to function for two or more purposes simultaneously; where the one or more humans are not required to have on their person any device capable of communicating with the network.

In an embodiment, the algorithms use two or more statistical methods to determine the presence of one or more humans according to two or more sets of performance criteria. In another embodiment, the system has the ability to perform self-optimization to achieve a set of two or more performances according to two or more preset criteria. In another embodiment, the communications protocols or network is generally defined by a standards committee including but not limited to protocols such as Bluetooth™ Low Energy, WiFi, Zigbee, Thread, and Z-Wave. In another embodiment, two or more statistical methods are applied to a measure of received signal strength to determine the presence of a human according to two or more sets of performance criteria. In another embodiment, the system uses machine learning to improve the detection capabilities of the two or more methods for determining presence where humans which have a fiducial element on their person train the system through: (1) using known location techniques to determine the location of the fiducial element; (2) using the system to locate the person; (3) comparing the location calculated by (1) of this paragraph to (2) of this paragraph; (4) adjusting the location determining methods using machine learning algorithms to improve the location calculating capabilities of the system.

In an embodiment, the systems and methods described herein include change detection. By way of example and not limitation, change detection may use or utilize a rolling baseline approach. In such an embodiment, a first baseline is established and compared with a second baseline, and any differences between the first and second baselines caused by the presence of a human in the detection network may be recognized by the system. This may be done by programming software to receive sets of wireless signal characteristic data from one or more nodes in the detection network and, based on such data, detecting changes in the RF environment caused by a human being present in a different position when the first baseline is established as compared to the second baseline. Such methods may be utilized when a system is first setup in a location to establish a minimal performance level without requiring a space be empty upon startup. Such systems with change detection may improve overtime to a state between change and presence where limited aspects of presence detection may be present in such a system.

Figure 3A:
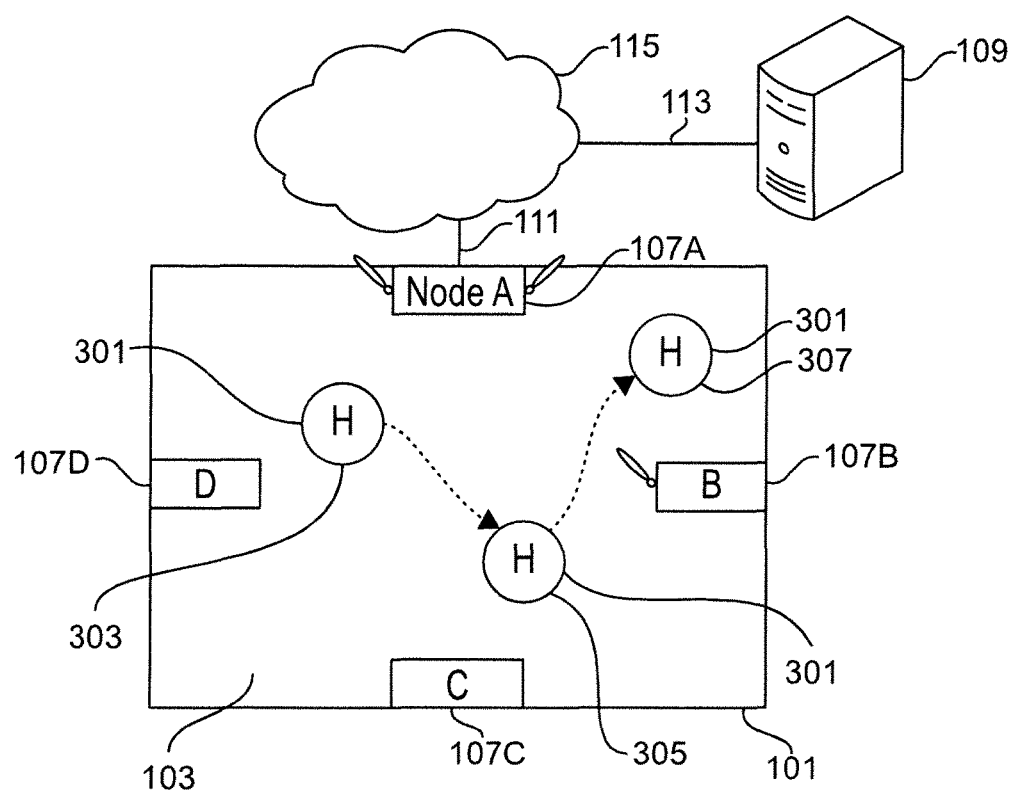
FIG. 3A depicts a schematic diagram of a system for change detection in a detection network over time according to the present disclosure.

An exemplary illustration of change detection is depicted in FIG. 3A. In the depicted embodiment of FIG. 3A, the RF environment of FIG. 1 is shown with a human (301) present in the environment (103) at a discreet position (303). As described elsewhere in this disclosure, the characteristics of wireless signal transmissions among the nodes (107A) to (107D) is influenced by the presence of the human (301). In this particular example, transmissions between node A (107A) and node D (107D) are influenced by the presence of the human (301). Thus, when the baseline is established (211) as shown in the method of FIG. 2, the baseline represents the wireless signal characteristics while the human (301) is present at the discreet position (303). If the human (301) moves to a new position (305), as can be seen if FIG. 3A, the characteristics of wireless signals among the nodes (107A) to (107D) will change.

In this particular exemplary embodiment, there will be little interference between nodes A (107A) and D (107D) when the human is at position (305). However, there will be greater interference between nodes B (107B) and C (107C), because the position (305) is disposed between those two nodes. Thus, when the differences are detected (205) as shown in FIG. 2, the change in position of the human can be detected.

This is less difficult to implement than presence sensing because the need to establish baselines in the detection network (103) without a human present is reduced. Such a system may detect changes within the detection network (103) based primarily on when a human changes positions, and updating the operative baseline profile on a rolling basis. That is, the baseline (211) is updated in this embodiment to be equal to the baseline when the human (301) is at position (305). Thus, when the human (301) moves to a third position (307), the differences detected (215) are as between the second baseline taken at position (305) and the wireless signal characteristics of detection network (103) when the human is at position (307). Likewise, the baseline (211) has been updated to be equal to the baseline in position (307), which can then be used to detect further changes in the position of a human (201). This detection method uses changes in the wireless signal baselines caused by changes in the position of a human (301) in the detection network (103). This system has many advantages over prior art motion detection technologies, such as passive infrared, in that this system is not obscured by objects and can detect slow or gradual changes in position, which may be overlooked by prior art systems. In an embodiment using this methodology, the baselines may be continuously updated.

In another embodiment, the system or method comprises making a confidence determination. This aspect may determine a degree of confidence that a third baseline corresponds to either a first or second set of baselines. The confidence determination may use any number of techniques, including techniques known in the art, such as supervised training or the use of statistical methods to determine a degree of similarity or difference between data sets. The confidence may increase or decrease over time, allowing for decisions to be automatically made with respect to baseline differences that are minimally different, but may still indicate the presence of a human in the detection network (103). Confidence in a determination of presence or absence of a human in the detection network (103) may be determined based on how similar a third baseline is to a first or second baseline. For example, if a third baseline is known to indicate the present of a mass whose impact on signal characteristics is known, comparing the first or second baseline to the third may improve (or decrease) the confidence level that the identified mass is the same as the mass identified in the third baseline. Based on confidence, the system can be configured to use different confidence thresholds in different operational contexts (e.g., HVAC, security, lighting, safety, etc.). A system or method including a confidence determination may operate across a plurality of systems using a common communication system, wherein the systems can include disparate nodes in communication with one another. A given node may operate in a plurality of detection networks (103), allowing for better system scaling when deploying the systems and methods to multiple adjacent detection networks (103).

In another embodiment, baseline differences may be used to count or estimate the number of humans present in the detection network. In an embodiment, this may be done by estimating the amount of human mass in the detection network, and dividing by an average mass per person. This may be done by establishing a first, empty baseline when there are no humans in the detection network (103), and establishing a second, occupied baseline when some known number of humans are present in the detection network (103). Next, a third baseline is taken and compared to the first empty baseline and the second occupied baseline. The system software then interprets where the third baseline wireless signal characteristics fit on a spectrum of profiles between the first empty baseline and the second occupied baseline, and from that determination estimate the total amount of human mass in the detection network (103). This estimation may be based upon the total mass of humans in the detection network when the second occupied baseline was established.

By way of example and not limitation, if the signal distortion in the third baseline is moderate as compared to the first empty baseline, the system may estimate that the amount of human mass present is relatively low. However, if the amount of signal distortion is closer to that shown in the second occupied baseline, the system may determine that the estimated amount of human mass present in the detection network (103) is closer to the amount that was present when the second baseline was taken. Similarly, if the amount of distortion is determined to be even more extreme than that reflected in the second baseline, the system may determine that the total amount of human mass present when the third baseline was taken exceeds the amount present when the second baseline was taken. The estimation of human mass may be based broadly upon the algorithms and methods described herein, and adjusted to estimate a number of humans in a space as generally described above.

In another embodiment, a system uses entrance and exit signatures in network diagnostic information to estimate the number of humans present in a space based upon such signatures.

In such a method, an entrance profile is established by a human entering a space, an exit profile is established by a human leaving the same space, and another later-captured profile is compared to the entrance and exit profiles to determine whether a human has entered or exited the space. Entrance and exit profiles are learned through normal system operation, based upon estimation from the presence detection technology and its determination following a state change. By way of example and not limitation, if a system detects a change and presence goes from not being detected to being detected, such an event may be classified as an entrance. Similarly, by way of example and not limitation, if the system detects a change and determines that a space has gone from occupied to unoccupied, such an event may be classified as an exit. The difference between entrance count and exit count may be used to estimate the number of humans present in the space.

In another embodiment, a system uses entrance and exit signatures in network diagnostic information in combination with people count estimates derived from comparing a sample profile against presence profiles of varying people counts.

Each of these methods may be used in conjunction with one or more counting methods to enhance the accuracy.

In an embodiment, the count or estimate of humans present in the detection network (103) may be used to operate another system, such as, but not necessarily limited to, a HVAC system.

In an embodiment, the location or position of a human in the detection network is estimated. This may be done by estimating the range between various devices to determine the location of a human, examining subset detection areas constructed from higher numbers of nodes, using various location baselines, and further extending the function of a location system to analyze locations over time to estimate speed and direction of a human in the detection network. In one embodiment of such a method, the system may use various node pairs, estimating the position of a human between those pairs based on baseline information, using overlapping estimates within the node pairs, then determining a highest probability position for a human in the detection network based on those overlapping estimates to determine the actual location of the human.

In another embodiment, systems with larger number of nodes can use more subset detection areas, generally each with three or more nodes, to determine the presence or absence of a human in each space, and estimate location based on overlapping occupied areas wherein the common occupied space might be assumed to be the most specific location of a human in the detection network. By way of example and not limitation, a set of four nodes may be subdivided into four sets of three nodes, where location may be determined based upon which subsets of three nodes presence is detected within. This sub-area creation allows for detections within subareas where such sub-shapes are defined by overlapping areas created with sets of three or more nodes. Alternatively, a plurality of baselines for humans in different locations within a detection network may be established, with subsequent baselines compared against said baselines to determine the location within the detection network of a human. By way of example and not limitation, a detection profile may be created for various locations within a detection area where a given detection profile corresponds with a human in a given position within the network, a sample profile is compared against a set of detection profiles corresponding to different positions, the system determines which detection profiles correlate most with the sample profile, and the system makes a determination of the location of the human based on the location of the detection profiles deemed most similar to the sample profile.

Figure 3B:
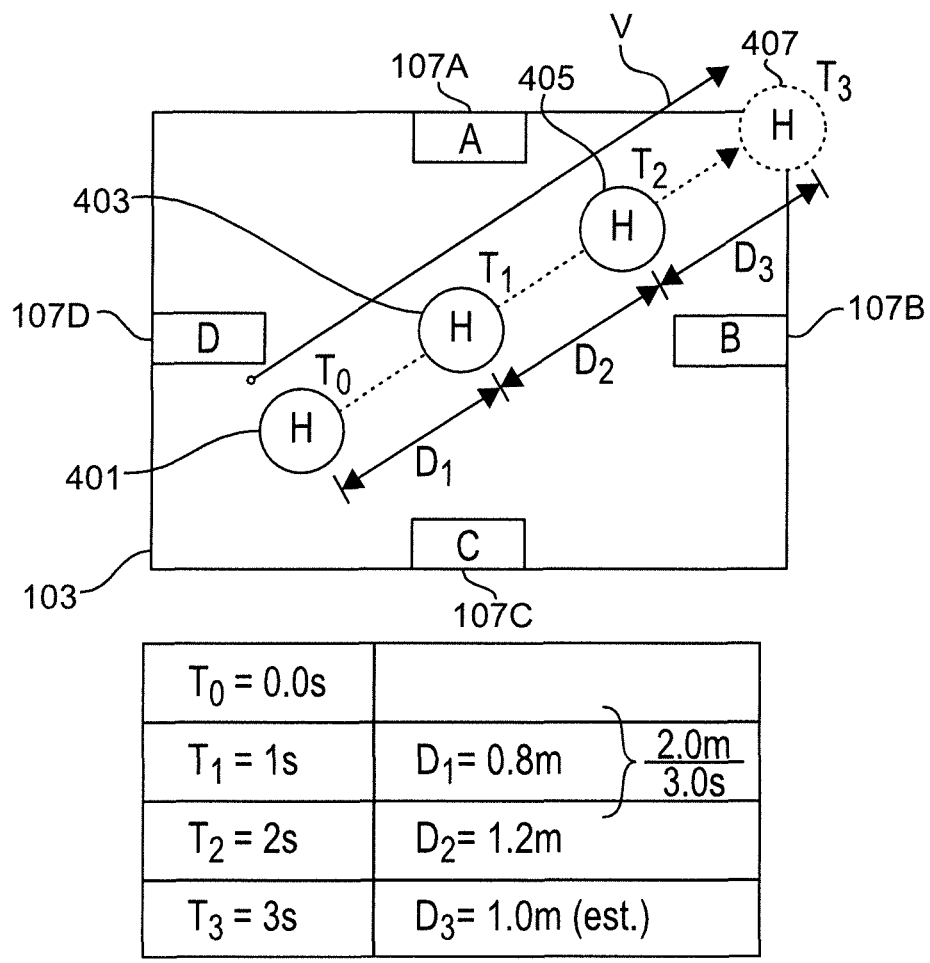
FIG. 3B depicts a schematic diagram of a system for detecting changes in locations of humans in a detection network over time according to the present disclosure.

Additionally, based on detected changes in locations of humans in the detection network over time, a human's travel speed and direction in the detection network may be estimated. This may be done, for example, through the use of interpolation and dead reckoning, or direct reconnaissance. An exemplary embodiment of such a system and method is depicted in FIG. 3B. In the depicted embodiment, a human is located in a detection network (103) at position (401) at $Time_0$. At a subsequent point in $Time_1$, the Human is detected at a different position (403). Because position (401) and position (403) are known, a $Distance_1$ between them can be calculated. Additionally, the amount of time elapsed from $Time_0$ to $Time_1$ can be determined or is known. Given that distance equals rate times time, the rate of movement of the human from position (401) to position (403) can be determined. Additionally, a Vector could be determined representing the movement of the human, embodying both direction and magnitude (speed).

Having only two sample points, however, raises the possibility of a high error rate, and more than two sample points is desired. For example, in the depicted embodiment, a third profile taken at $Time_2$ places the human at position (405). Again, the $Distance_2$ from position (403) to position (405) can be determined, and a rate of speed between these positions may also be determined. In the depicted embodiment, these positions are generally linear, suggesting that the human is moving in a more or less straight line in a given direction, defined by Vector. The system may thus further estimate the future or expected position of the human based on this data. That is, at $Time_3$ an estimated position (407) of the human may be determined based on the prior detected locations. This estimate may place the human outside of the detection network (103), and may be further used to estimate the arrival or departure of a human in or from the detection network (103). Additionally, this information may be used to alert another segment of the detection network, or another detection network entirely, of a potentially soon to be arriving human. This may be done, for example, by communications using the computer server (109) via the network (115).

Continuing the exemplary embodiment above, in the depicted embodiment, the human's detected change in position from $Time_0$ to $Time_1$ is 0.8 meters in one second, for a speed of 0.8 meters per second. The detected change in distance from $Time_1$ to $Time_2$ is 1.2 meters, with one additional elapsed second, or, 2.0 total meters over two total elapsed seconds, for an average speed of one meter per second. Thus, at $Time_3$, one second later, an additional one meter of movement may be anticipated, making the estimated future position (407) one meter further along Vector than position (405).

In an embodiment, the systems and methods use machine learning to further train the system over time. By way of example and not limitation, a system may accumulate data from one or more of the above-described change detection techniques using a combination of known feedback and/or feedback from third party systems such as but not limited to interactions with other smart devices (thermostats, voice recognition systems, etc.), and/or use inference over time to improve operation based on expected or anticipated system behavior. Such inferences may be based upon ordinary behavior in a space, direct interaction with elements of the system, or sample profile changes from human reactions to system decisions. By way of example and not limitation, in a system implementing change detection to operate lighting or HVAC systems, user feedback may be provided to the system as supervised training data, indicating whether a given operation was correct (i.e., whether a change in the lighting or HVAC system should have been made or not).

Similarly, in a system implementing presence detection, a user may force change detection to trigger while within a detection network, providing the system an automated means to establish a baseline practice for the occupied space based upon the time that change triggering events occur and, facilitating times far removed from change triggering events to be detected as generally empty. When combined with inferring occupancy based on room type, such a method may facilitate the system training itself, improving functionality over time from change detection to presence detection level functionality. Effectively, by using the system based on change detection, the system may infer presence and absence, allowing it to establish baseline profiles for when no human is present and detection profiles based on when there is a human present. In such a way, the system would be capable of training itself to move from operating as a change detection system into one operating as a true presence detection system.

In an embodiment implementing counting, combinations of change detection and presence detection may determine an estimated count of humans within a detection network, estimating such counting baseline profiles and improving them over time. Such a system may facilitate the system training itself over time to count the number of humans within the detection network.

In an embodiment implementing locating people, combinations of change detection, presence detection, and counting people may be utilized to determine estimates of location based on overlapping areas and occupancy counts, eventually establishing more accurate baseline estimates, allowing the system over time to improve locating humans within a detection network. Such a system may comprise an inference engine, such as computer software running on the server, and/or build an estimation of expected system operation from normal operations, and may adjust operational parameters in accordance with expected behavior. For example, if a detection area is typically empty from 10:00 am until 3:00 pm, and occupied from 3:00 pm until 6:00 pm, parameters may be adjusted to expect emptiness from 10:00 am-3:00 pm and to expect presence from 3:00 pm until 6:00 pm). Such inferences may be developed over time and may improve performance at those times, while maintaining overall flexibility.

Nodes may be disposed in various location combinations to improve system operation. A system may operate with nodes located on walls, ceilings, fixed nodes, mobile nodes, and/or in mixed configurations. Because spaces are three-dimensional, detection areas may be defined by nodes on different floors of a building. Nodes may be placed on walls in positions such as switches and outlets. The broadcast range generally defines the perimeter of a detection area, and the system may be configured to examine network diagnostics assuming humans are within said perimeter.

In an embodiment, one or more nodes may be placed on a ceiling. By way of example and not limitation, this might occur when nodes are integrated into fixtures and/or lighting systems. In such an embodiment, nodes may radiate generally downward into the detection area, and a system may be configured to examine network diagnostics based on different radiation and multi-path patterns than might be seen from a switch and outlet based system. In such an embodiment, nodes generate communications in a generally downward direction where reflections from walls, objects, and floors generally ensure that the RF energy reaches other nodes via multipath. The multipath also generally provides for coverage of the detection area. Such coverage due to multipath means that ceiling mounted nodes function similarly to wall mounted nodes with regards to the impact of a human on network diagnostic information.

Other fixed nodes are also contemplated, such as, without limitation: televisions; monitors; and, smart home hubs. Such nodes may be installed on a wall, ceiling, or at a fixed location. Still other nodes, such as smartphones, tablets, and laptop computers, may be used in a detection network as a mobile node. However, in such an embodiment, a mobile node may first locate itself relative to fixed nodes in the system. Having its location established within the network may further enhance the accuracy of the system.

In an embodiment, combinations of nodes may be used in a detection area. When combining larger number of nodes, the system may determine the optimal nodes for operation. Optimal nodes may be determined by, among other things, determining the most efficient nodes for a chosen level of functionality. As node count increases, accuracy of determination generally increases, as does level of functionality.

In an embodiment, one or more nodes may operate in a plurality of detection areas. This facilitates improved system scaling, particularly for adjacent detection areas. Such scaling may additionally result in inference within a larger network of nodes including the plurality of detection areas, further facilitating the tracking of human detections from one detection area to the next. For example, nodes may be shared between detection areas. A given node in a first detection network may have network diagnostic information based on communications within said first detection area, and may also be part of a second detection network and have network diagnostic information based on communications within said second detection network. The system can make independent decisions on how to operate third party systems in each of the two detection areas. Examining inference across detection areas can improve the determination of the presence or absence of humans within the detection areas, particularly where a person leaves one detection area and enters another. Detected changes in signal characteristics can be used to determine the presence or absence of a human in the individual areas, based on information shared between the first and second detection area.

In an embodiment, the systems and methods may operate through the use of a mass identification technique. In such an embodiment, a "mass" is identified and tracked. A unique identity may be assigned to the mass by the computer systems, and tracked based on changes to wireless signal characteristics. By way of example, and not limitation, if a mass is first detected near the center of a room, and next detected at a location several feet away from the center of the room, but the system has not detected any other masses as entering the room, the system may infer that the second detected mass is the same mass as the first detected mass, but has relocated to a new position. Based on the difference in signal characteristics caused by the interference of the mass in the network, the system may infer, for example, that other masses exhibiting similar movement would have similar effects on the signal characteristics. In this way, the system can "learn" how to identify a mass, and track it.

Although each human mass in the system causes different interference characteristics when disposed at any location, for most indoor locations, the total set of humans likely to be present in a room is generally finite. That is, most indoor spaces are, for any appreciable length of time, occupied by the same basic set of people most of the time, with only minor and infrequent variations. For example, the same set of people generally show up each day to a workplace, or a school, or even a public location such as a restaurant. Because most indoor spaces can only be entered from a limited number of points of entry, such as doorways, the system can detect a person entering at the point of ingress, and determine the specific interference pattern caused by the presence of that particular human upon entering the space. Based on the signal characteristics (interference) and the way that those characteristics change compared to other humans in the space, it can be determined where and how each human mass moves through the room.

It is contemplated that a system may automate various aspects of setup, particularly with regards to grouping nodes into detection areas and building levels of functionality nominally based on the machine learning methods described herein. A system which determines nearest nodes and estimates detection areas through inference requires no setup by a user. Based upon best estimates, a user may simply place nodes throughout a building, and the nodes automatically group into detection areas using unsupervised machine learning, ultimately resulting in a building system learning how to detect occupants. Occupancy can then be related to actions taken by occupants, developing an automation system which reduces or eliminates the need for human input for normal system operation.

In an embodiment, the method is a method for detecting the presence of a human comprising: providing a first transceiver disposed at a first location within a detection area; providing a second transceiver disposed at a second location within said detection area; a computer server communicably coupled to said first transceiver; said first transceiver receiving a first set of wireless signals from said second transceiver; said computer server: receiving a first set of signal data from said first transceiver, said first set of signal data comprising data about properties of said first set of wireless signals; inferring that said first set of signal data is indicative of the presence of a human in said detection area; creating a detection signal profile for wireless communications from said second transceiver to said first transceiver based at least in part on said properties of said first set of wireless signals in said first set of signal data when a human is inferred present in said detection area; said first transceiver receiving a second set of wireless signals from said second transceiver; said computer server: receiving a second set of signal data from said first transceiver, said second set of signal data comprising data about properties of said second set of wireless signals; inferring that said second set of signal data is indicative of the absence of any humans in said detection area; creating a baseline signal profile for wireless communications from said second transceiver to said first transceiver based at least in part on said properties of said second set of wireless signals in said second set of signal data when the absence of any humans in in said detection area is inferred; said first transceiver receiving a third set of wireless signals from said second transceiver; said computer server receiving a third set of signal data from said first transceiver, said third set of signal data comprising data about properties of said third set of wireless signals; determining whether said third set of signal data is indicative of the presence of a human, or absence of any humans, in said detection area, said determining based at least in part a comparison of said third set of signal data to said detection signal profile and said baseline signal profile.

In a further embodiment, the method comprises: in said inferring that said first set of signal data is indicative of the presence of a human in said detection area, said inferring is based at least in part on additional signal data sets for signals received by said first transceiver from other transceivers in the detection area; and in said inferring that said second set of signal data is indicative of the absence of any humans in said detection area, said inferring is based at least in part on additional signal data sets for signals received by said first transceiver from other transceivers in the detection area.

In a further embodiment, the method comprises: said computer server storing a plurality of historical data records indicative of whether a human was determined to be present in said detection area over a period of time, each of said historical data records comprising an indication of a number of humans determined to be present in said detection area and a date and time when each of said number of humans was determined to be present in said detection area; and said computer server making at least some of said plurality of historical data records available to one or more external computer systems via an interface.

In a further embodiment, the method comprises: said computer server is operatively coupled to a second system; and only after said computer server determines a human is present in said detection area, said computer server operates said second system.

In a further embodiment, the method comprises: said first transceiver and said second system are configured to communicate using an identical communication protocol.

In a further embodiment, the method comprises: said second system is selected from the group consisting of: an electrical system; a lighting system; a heating, venting, and cooling (HVAC) system; a security system; and, an industrial automation system, an electrical system.

In a further embodiment, the method comprises: said wireless communication utilizes a protocol selected from the group consisting of: Bluetooth™, Bluetooth™ Low Energy, ANT, ANT+, WiFi, Zigbee, Thread, and Z-Wave.

In a further embodiment, the method comprises: said wireless communications from said second transceiver to said first transceiver have a carrier frequency in the range of 850 MHz and 17.5 GHz inclusive.

In a further embodiment, the method comprises: said computer server determining whether said third set of signal data is indicative of the presence of a human includes a confidence metric.

In a further embodiment, the method comprises: said first transceiver and said second transceiver are configured to calculate their relative positions within said detection area automatically.

In another embodiment, the method comprises a method for estimating the number of humans present in an area comprising: providing a first transceiver disposed at a first location within a detection area; providing a second transceiver disposed at a second location within said detection area; a computer server communicably coupled to said first transceiver; said first transceiver receiving a first set of wireless signals from said second transceiver when no humans are present within said detection area; said computer server receiving a first set of signal data from said first transceiver, said first set of signal data comprising data about properties of said first set of wireless signals; said computer server creating a baseline signal profile for wireless communications from said second transceiver to said first transceiver, said baseline signal profile being based at least in part on said properties of said first set of wireless signals in said first set of signal data when no humans are present in said detection area; said first transceiver receiving a second set of wireless signals from said second transceiver when a first plurality of humans is present in said detection area, said first plurality of humans having a total mass; said computer server receiving a second set of signal data from said first transceiver, said second set of signal data comprising data about properties of said second set of wireless signals; said computer server creating a second baseline signal profile for wireless communications from said second transceiver to said first transceiver, said second baseline signal profile being based at least in part on said properties of said second set of wireless signals in said second set of signal data when said first plurality of humans is present in said detection area; said first transceiver receiving a third set of wireless signals from said second transceiver when a second plurality of humans is present within said detection area; said computer server receiving a third set of signal data from said first transceiver, said third set of signal data comprising data about properties of said third set of wireless signals; said computer server estimating the total mass of said second plurality of humans, said estimating based at least in part on a comparison of said properties of said third set of wireless signals in said third set of wireless signal data to said baseline signal profile and to said baseline signal profile; said computer server estimating the total number of humans in said plurality of humans based at least in part on dividing said estimated total mass of said plurality of humans by an average mass per human.

In a further embodiment, the method comprises: said computer server estimating the total mass of said second plurality of humans is further based at least in part on a comparison of said properties of said third set of wireless signals in said third set of wireless signal data to said properties of said second set of wireless signals in said second set of wireless signal data.

In a further embodiment, the method comprises: said properties of said first set of wireless signals, said second set of wireless signals, and said third set of wireless signals comprise wireless network signal protocol properties determined by said first transceiver.

In a further embodiment, the method comprises: each of said wireless network signal protocol properties is selected from the group consisting of: received signal strength, latency, and bit error rate.

In a further embodiment, the method comprises: said computer server estimating comprises interpolating the total mass of humans in said second plurality of humans.

In a further embodiment, the method comprises: said interpolating uses an assumed mass of zero for said baseline signal profile and said total mass of humans in said first plurality of humans for said second baseline signal profile.

In a further embodiment, the method comprises: said total mass is a discrete user-supplied quantity.

T In a further embodiment, the method comprises: said average mass per human is a discrete user-supplied quantity.

In a further embodiment, the method comprises: said computer server storing a plurality of historical data records indicative of whether a human was present in the detection area over a period of time, each of said historical data records comprising an indication of a number of humans detected in said detection area and a date and time when each of said number of humans was detected in said detection area; and said computer server making at least some of said plurality of historical data records available to one or more external computer systems via an interface.

In a further embodiment, the method comprises: said computer server estimating the total mass of said second plurality of humans is adjusted based on machine learning comprises: determining a first sample total mass of a plurality of humans having a fiducial element in said detection area, said first sample mass being determined based upon detecting said fiducial element; determining a second sample total mass of said plurality of humans in said detection area, said second sample mass being determined based at least in part on a comparison of said received second set of signal data to said baseline signal profile; comparing said first sample mass and said second sample mass; and adjusting said estimation of said total mass of said second plurality of humans based upon said comparing.

In a further embodiment, the method comprises: said computer server estimating the total mass of said second plurality of humans is adjusted based on machine learning comprises: determining a first sample total mass of a plurality of humans based on inferences in said detection area; determining a second sample total mass of a plurality of humans in said detection area, said second sample mass being determined based at least in part on a comparison of said received second set of signal data to said baseline signal profile; comparing said first sample mass and said second sample mass; and adjusting said determination of said second sample mass based upon said comparing.

In a further embodiment, the method comprises: said determining a first sample location of a human based on inference in said detection area comprises said computer server inferring from a detected operation of a network element in said detection area that a human is present in said detection area near said network element.

In a further embodiment, the method comprises: said network component is a component of an electrical system, a lighting system, a heating, venting, and cooling (HVAC) system, a security system, or an industrial automation system.

In a further embodiment, the method comprises: n said estimating the total number of humans in said plurality of humans includes a confidence metric.

In a further embodiment, the method comprises: said first transceiver and said second transceiver are configured to calculate their relative positions within said detection area automatically.

In a further embodiment, the method comprises: said wireless communication utilizes a protocol selected from the group consisting of: Bluetooth™, Bluetooth™ Low Energy, ANT, ANT+, WiFi, Zigbee, Thread, and Z-Wave.

In a further embodiment, the method comprises: said wireless communications from said second transceiver to said first transceiver have a carrier frequency in the range of 850 MHz and 17.5 GHz inclusive.

While the invention has been disclosed in conjunction with a description of certain embodiments, including those that are currently believed to be preferred embodiments, the detailed description is intended to be illustrative and should not be understood to limit the scope of the present disclosure. As would be understood by one of ordinary skill in the art, embodiments other than those described in detail herein are encompassed by the present invention. Modifications and variations of the described embodiments may be made without departing from the spirit and scope of the invention.

The invention claimed is:

1. A method for estimating the number of humans in a space comprising:
   providing a plurality of transceivers in wireless communication with each other and disposed in a detection area;
   providing a computer server in communication with each transceiver in said plurality of transceivers;
   determining, at said computer server, a first signal profile for characteristics of wireless communications among said plurality of transceivers when no humans are present in said detection area;
   determining, at said computer server, a second signal profile for characteristics of wireless communications among said plurality of transceivers when a first plurality of humans is present in said detection area, the number of humans in said first plurality being known;
   determining, at said computer server, a third signal profile for characteristics of wireless communications among said plurality of transceivers when a second plurality of humans is present in said detection area, the number of humans in said second plurality being unknown; and
   using said first signal profile, said second signal profile, and said known number of humans in said first plurality of humans, estimating said unknown number of humans in said second plurality of humans.

2. The method of claim 1 where said estimate is time stamped and recorded periodically.

3. The method of claim 1 where said estimate is provided to a requesting party.

4. The method of claim 3 wherein said requesting party comprises first responders to an emergency at said space.

5. The method of claim 3 wherein said requesting party comprises a robot.

6. The method of claim 1 wherein said signal characteristics are selected from the group consisting of: received signal strength, latency, and bit error rate.

7. The method of claim 1 wherein said estimate is updated by new information from said plurality of transceivers periodically.

8. The method of claim 1, further comprising indicating when one of said transceivers is no longer transmitting.

9. The method of claim 1, further comprising providing information received at said computer server from other sensors in said detection area and information from one or more sensors disposed external said detection area.

10. The method of claim 1, wherein estimating said unknown number of humans in said said plurality of humans comprises comparing signal distortion in said third single profile to signal distortion in said first signal profile and signal distortion in said second signal.

* * * * *